(12) United States Patent
Sakakibara

(10) Patent No.: US 11,063,072 B2
(45) Date of Patent: Jul. 13, 2021

(54) IMAGE CAPTURING APPARATUS AND ELECTRONIC DEVICE

(71) Applicant: SONY SEMICONDUCTOR SOLUTIONS CORPORATION, Kanagawa (JP)

(72) Inventor: Masaki Sakakibara, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/319,399

(22) PCT Filed: Jul. 25, 2017

(86) PCT No.: PCT/JP2017/026765
§ 371 (c)(1),
(2) Date: Jan. 21, 2019

(87) PCT Pub. No.: WO2018/030137
PCT Pub. Date: Feb. 15, 2018

(65) Prior Publication Data
US 2019/0280025 A1    Sep. 12, 2019

(30) Foreign Application Priority Data

Aug. 8, 2016 (JP) .............................. JP2016-155291

(51) Int. Cl.
*H01L 27/146* (2006.01)
*H04N 5/33* (2006.01)
(Continued)

(52) U.S. Cl.
CPC ...... *H01L 27/14603* (2013.01); *H01L 27/142* (2013.01); *H03M 1/08* (2013.01);
(Continued)

(58) Field of Classification Search
CPC .. H04N 5/3745; H04N 5/378; H04N 5/37455; H03M 1/56; H01L 27/14603
See application file for complete search history.

(56) References Cited

U.S. PATENT DOCUMENTS

2010/0036211 A1\* 2/2010 La Rue ................ A61B 5/0002
                                                                  600/301
2011/0032401 A1    2/2011 Nikai
(Continued)

FOREIGN PATENT DOCUMENTS

CN    107079124 A    8/2017
JP    2007-151170 A    6/2007
(Continued)

OTHER PUBLICATIONS

International Search Report and Written Opinion of PCT Application No. PCT/JP2017/026765, dated Oct. 10, 2017, 12 pages of ISRWO.

*Primary Examiner* — Christopher K Peterson
(74) *Attorney, Agent, or Firm* — Chip Law Group

(57) ABSTRACT

The present technology relates to an image capturing apparatus and an electronic device that are capable of reducing noise.

A photoelectric conversion element, a conversion unit configured to convert a signal from the photoelectric conversion element into a digital signal, and a control unit configured to control current flowing to an analog circuit on the basis of an output signal from the conversion unit are provided. The conversion unit converts the signal from the photoelectric conversion element into a digital signal by using a slope signal having a level that monotonically decreases as time elapses. The control unit performs control to increase or reduce current flowing to the analog circuit in a case where
(Continued)

the output signal has a large level. The present technology is applicable to, for example, an image capturing apparatus.

20 Claims, 30 Drawing Sheets

(51) Int. Cl.
| | |
|---|---|
| *H03M 1/08* | (2006.01) |
| *H04N 5/32* | (2006.01) |
| *H04N 5/3745* | (2011.01) |
| *H03M 1/56* | (2006.01) |
| *H04N 5/378* | (2011.01) |
| *H01L 27/142* | (2014.01) |
| *H04N 5/341* | (2011.01) |
| *H04N 5/357* | (2011.01) |
| *H01L 31/02* | (2006.01) |
| *H04N 5/225* | (2006.01) |
| *H04N 5/369* | (2011.01) |

(52) U.S. Cl.
CPC ............... *H03M 1/56* (2013.01); *H04N 5/32* (2013.01); *H04N 5/33* (2013.01); *H04N 5/341* (2013.01); *H04N 5/357* (2013.01); *H04N 5/378* (2013.01); *H04N 5/3745* (2013.01); *H01L 27/14634* (2013.01)

(56) References Cited

U.S. PATENT DOCUMENTS

| | | | |
|---|---|---|---|
| 2012/0119063 A1 | 5/2012 | Takamiya et al. | |
| 2014/0034812 A1 | 2/2014 | Ikuma et al. | |
| 2014/0293107 A1* | 10/2014 | Nishihara | H04N 5/379 |
| | | | 348/308 |
| 2015/0009387 A1 | 1/2015 | Taura | |
| 2015/0237282 A1 | 8/2015 | Shimada | |
| 2016/0021323 A1 | 1/2016 | Aibara | |
| 2017/0272678 A1* | 9/2017 | Sakakibara | H01L 27/1464 |

FOREIGN PATENT DOCUMENTS

| | | |
|---|---|---|
| JP | 2008-118634 A | 5/2008 |
| JP | 2010-041457 A | 2/2010 |
| JP | 2011-040855 A | 2/2011 |
| JP | 2012-109658 A | 6/2012 |
| JP | 2015-156581 A | 8/2015 |
| JP | 2016-025427 A | 2/2016 |
| JP | 2016-058763 A | 4/2016 |
| WO | 2012/144234 A1 | 10/2012 |
| WO | 2016/072280 A1 | 5/2016 |

\* cited by examiner

IMAGE CAPTURING APPARATUS AND ELECTRONIC DEVICE

CROSS REFERENCE TO RELATED APPLICATIONS

This application is a U.S. National Phase of International Patent Application No. PCT/JP2017/026765 filed on Jul. 25, 2017, which claims priority benefit of Japanese Patent Application No. JP 2016-155291 filed in the Japan Patent Office on Aug. 8, 2016. Each of the above-referenced applications is hereby incorporated herein by reference in its entirety.

TECHNICAL FIELD

The present technology relates to an image capturing apparatus and an electronic device, and relates to an image capturing apparatus and an electronic device that are capable of adaptively changing noise level to capture an image at improved image quality.

BACKGROUND ART

Conventional electronic devices having an image capturing function, such as digital still cameras and digital video cameras, include image sensors such as charge coupled device (CCD) and complementary metal oxide semiconductor (CMOS) image sensors, for example.

Each image sensor includes a pixel in which a photodiode (PD) configured to perform photoelectric conversion is combined with a plurality of transistors, and produces an image on the basis of pixel signals output from a plurality of planarly disposed pixels. Furthermore, the pixel signals output from the pixels are AD converted in parallel by, for example, a plurality of analog-to-digital (AD) converters disposed for respective pixel columns and are output.

Patent Document 1 discloses an image capturing apparatus intended to achieve reduction of electric power consumption and random noise.

CITATION LIST

Patent Document

Patent Document 1: Japanese Patent Application Laid-open No. 2007-151170

SUMMARY OF THE INVENTION

Problems to be Solved by the Invention

The noise level of an image sensor is defined by thermal noise, 1/f noise, and quantization noise. The gm of a circuit can be improved to reduce the thermal noise, but this probability leads to increases of current consumed at an analog circuit and electrical power increase.

Furthermore, the 1/f noise is sensitive to current but mainly determined by an area and a process, and their measurement potentially leads to cost increase. The quantization noise is uniquely determined by the resolution of an AD converter, but at low illuminance, is defined by random noise of the image sensor and the quantization noise of the AD converter, and the thermal noise and the 1/f noise as random noise depend on the amount of current consumed at an analog circuit.

The present technology has been made in view of such a situation, and is intended to achieve low electrical power at high illuminance and low noise at low illuminance by adaptively adjusting current consumed at an analog circuit in a variable manner on the basis of an AD converted output signal.

Solutions to Problems

An image capturing apparatus according to an aspect of the present technology includes: a photoelectric conversion element; a conversion unit configured to convert a signal from the photoelectric conversion element into a digital signal; and a control unit configured to control current flowing to an analog circuit on the basis of an output signal from the conversion unit.

An electronic device according to an aspect of the present technology includes an image capturing apparatus including: a photoelectric conversion element; a conversion unit configured to convert a signal from the photoelectric conversion element into a digital signal; and a control unit configured to control current flowing to an analog circuit on the basis of an output signal from the conversion unit.

An image capturing apparatus according to an aspect of the present technology includes: a photoelectric conversion element; a conversion unit configured to convert a signal from the photoelectric conversion element into a digital signal; and a control unit configured to control current flowing to an analog circuit on the basis of an output signal from the conversion unit.

An electronic device according to an aspect of the present technology includes the image capturing apparatus.

Note that the image capturing apparatus and the electronic device may be independent devices or may be internal blocks included in one device.

Effects of the Invention

According to an aspect of the present technology, low electrical power at high illuminance and low noise at low illuminance can be achieved by adaptively adjusting current consumed at an analog circuit in a variable manner on the basis of an AD converted output signal.

Note that the effects described herein are not necessarily limited, and any of the effects described in the present disclosure may be applied.

MODE FOR CARRYING OUT THE INVENTION

Hereinafter, modes (hereinafter referred to as embodiments) for implementing the present technology will be described.

<Exemplary Schematic Configuration of Image Capturing Apparatus>

Figure 1:
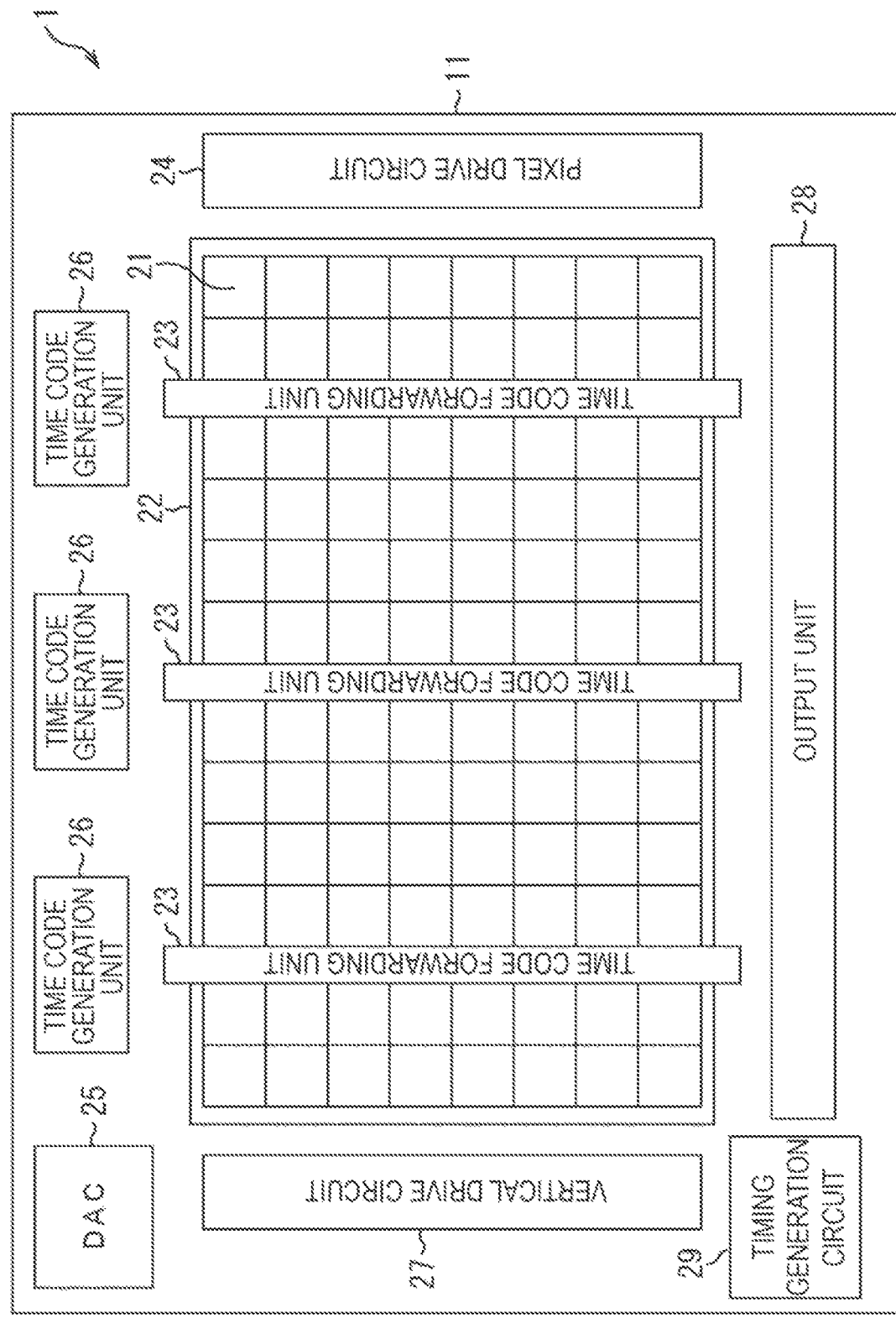
FIG. 1 is a diagram illustrating a schematic configuration of an image capturing apparatus according to the present disclosure.

FIG. 1 illustrates a schematic configuration of an image capturing apparatus according to the present disclosure.

An image capturing apparatus 1 in FIG. 1 includes a pixel array unit 22 in which pixels 21 are arranged in a two-dimensional array on a semiconductor substrate 11 including semiconductor such as silicon (Si). The pixel array unit 22 includes a time code forwarding unit 23 configured to forward a time code generated by a time code generation unit 26 to each pixel 21. Then, a pixel drive circuit 24, a D/A Converter (DAC) 25, the time code generation unit 26, a vertical drive circuit 27, an output unit 28, and a timing generation circuit 29 are formed around the pixel array unit 22 on the semiconductor substrate 11.

Each of the pixels 21 arranged in a two-dimensional array includes a pixel circuit 41 and an ADC 42 as described later with reference to FIG. 2. The pixel 21 generates an electric charge signal in accordance with the amount of light received by a light receiving element (for example, a photodiode) in the pixel, converts the generated signal into a digital pixel signal SIG, and outputs the converted signal.

The pixel drive circuit 24 drives the pixel circuit 41 (FIG. 2) in each pixel 21. The DAC 25 functions as a generation unit configured to generate a reference signal (reference voltage signal) REF as a slope signal having a level (voltage) that monotonically decreases as time elapses, and supplies the generated reference signal (reference voltage signal) REF to each pixel 21. The time code generation unit 26 generates a time code used at conversion (AD conversion) of the analog pixel signal SIG into a digital signal at each pixel 21, and supplies the generated time code to the corresponding time code forwarding unit 23.

A plurality of the time code generation units 26 are provided for the pixel array unit 22, and the time code forwarding units 23 in a number corresponding to that of the time code generation unit 26 are provided in the pixel array unit 22. Thus, the time code generation units 26 correspond to the respective time code forwarding units 23 that forward time codes generated by the corresponding time code generation units 26.

The vertical drive circuit 27 performs control to output the digital pixel signal SIG generated in each pixel 21 to the output unit 28 in a predetermined order on the basis of a timing signal supplied from the timing generation circuit 29. The digital pixel signal SIG output from the pixel 21 is output out of the image capturing apparatus 1 through the output unit 28. The output unit 28 performs predetermined digital signal processing such as black level correction processing of correcting the black level or correlated double sampling (CDS) processing on the pixel signal SIG as necessary, and thereafter externally outputs the signal.

The timing generation circuit 29 is achieved by, for example, a timing generator configured to generate various timing signals, and supplies the generated various timing signals to the pixel drive circuit 24, the DAC 25, the vertical drive circuit 27, and the like.

The image capturing apparatus 1 is configured as described above. Note that, in FIG. 1, all circuits included in the image capturing apparatus 1 are formed on the single semiconductor substrate 11 as described above, but may be separately disposed on a plurality of semiconductor substrates 11 as described later.

<Detailed Exemplary Configuration of Pixel>

Figure 2:
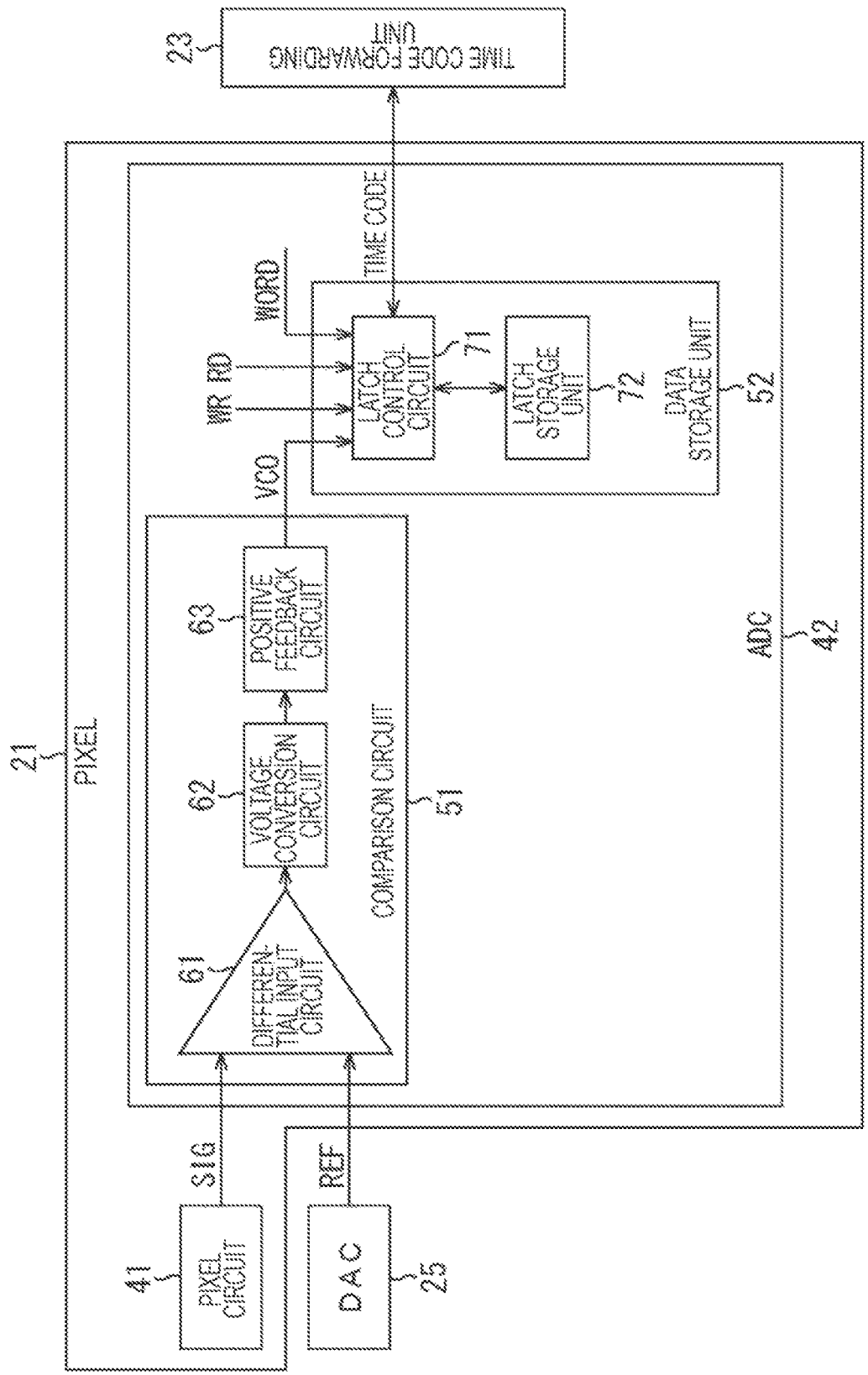
FIG. 2 is a block diagram illustrating a detailed exemplary configuration of a pixel.

FIG. 2 is a block diagram illustrating a detailed exemplary configuration of each pixel 21.

The pixel 21 includes the pixel circuit 41 and the AD converter (ADC) 42.

The pixel circuit 41 outputs an electric charge signal in accordance with the amount of received light to the ADC 42 as the analog pixel signal SIG. The ADC 42 converts the analog pixel signal SIG supplied from the pixel circuit 41 into a digital signal.

The ADC 42 includes a comparison circuit 51 and a data storage unit 52.

The comparison circuit 51 compares the pixel signal SIG with the reference signal REF supplied from the DAC 25, and outputs an output signal VCO as a comparison result signal indicating a result of the comparison. The comparison circuit 51 inverts the output signal VCO when the pixel signal SIG is same as (has a voltage same as that of) the reference signal REF.

The comparison circuit 51 includes a differential input circuit 61, a voltage conversion circuit 62, and a positive feedback (PFB) circuit 63. Details thereof will be described later with reference to FIG. 3.

The data storage unit 52 receives the output signal VCO from the comparison circuit 51, and is additionally supplied with, from the vertical drive circuit 27, a WR signal indicating a pixel signal writing operation, a RD signal indicating a pixel signal reading operation, and a WORD signal controlling the timing of reading from the pixel 21 in the pixel signal reading operation from the vertical drive circuit 27. Furthermore, the data storage unit 52 is also supplied with a time code generated by the time code generation unit 26 through the time code forwarding unit 23.

The data storage unit 52 includes a latch control circuit 71 configured to control time code writing and reading operations on the basis of the WR signal and the RD signal, and a latch storage unit 72 configured to store the time code.

While the High (Hi) output signal VCO is input from the comparison circuit 51 in the time code writing operation, the latch control circuit 71 stores, in the latch storage unit 72, the time code supplied from the time code forwarding unit 23 and updated at each unit time.

Then, when the pixel signal SIG has become same as (has a voltage same as that of) the reference signal REF and the output signal VCO supplied from the comparison circuit 51 has been inverted to Low (Lo), writing (update) of the supplied time code is stopped, and a time code stored in the latch storage unit 72 last is held by the latch storage unit 72. The time code stored in the latch storage unit 72 indicates a time at which the pixel signal SIG becomes equal to the reference signal REF, and indicates data indicating that the pixel signal SIG is at a reference voltage at the time, in other words, a digitized light amount value.

After sweep of the reference signal REF ends and time codes are stored in the latch storage units 72 of all pixels 21 in the pixel array unit 22, the operation of the pixels 21 is changed from the writing operation to the reading operation.

In the time code reading operation, at the reading timing of each pixel 21, the latch control circuit 71 outputs the time code (digital pixel signal SIG) stored in the latch storage unit 72 to the time code forwarding unit 23 on the basis of the WORD signal that controls the reading timing. The time code forwarding unit 23 sequentially forwards each supplied time code in the column direction (vertical direction) to supply the time code to the output unit 28.

Hereinafter, the digitized pixel data indicating that the pixel signal SIG is at the reference voltage at that time, which is an inverted time code when the output signal VCO read from the latch storage unit 72 in the time code reading operation is inverted, is also referred to as AD conversion pixel data to distinguish the data from a time code written to the latch storage unit 72 in the time code writing operation.

<First Exemplary Configuration of Comparison Circuit>

Figure 3:
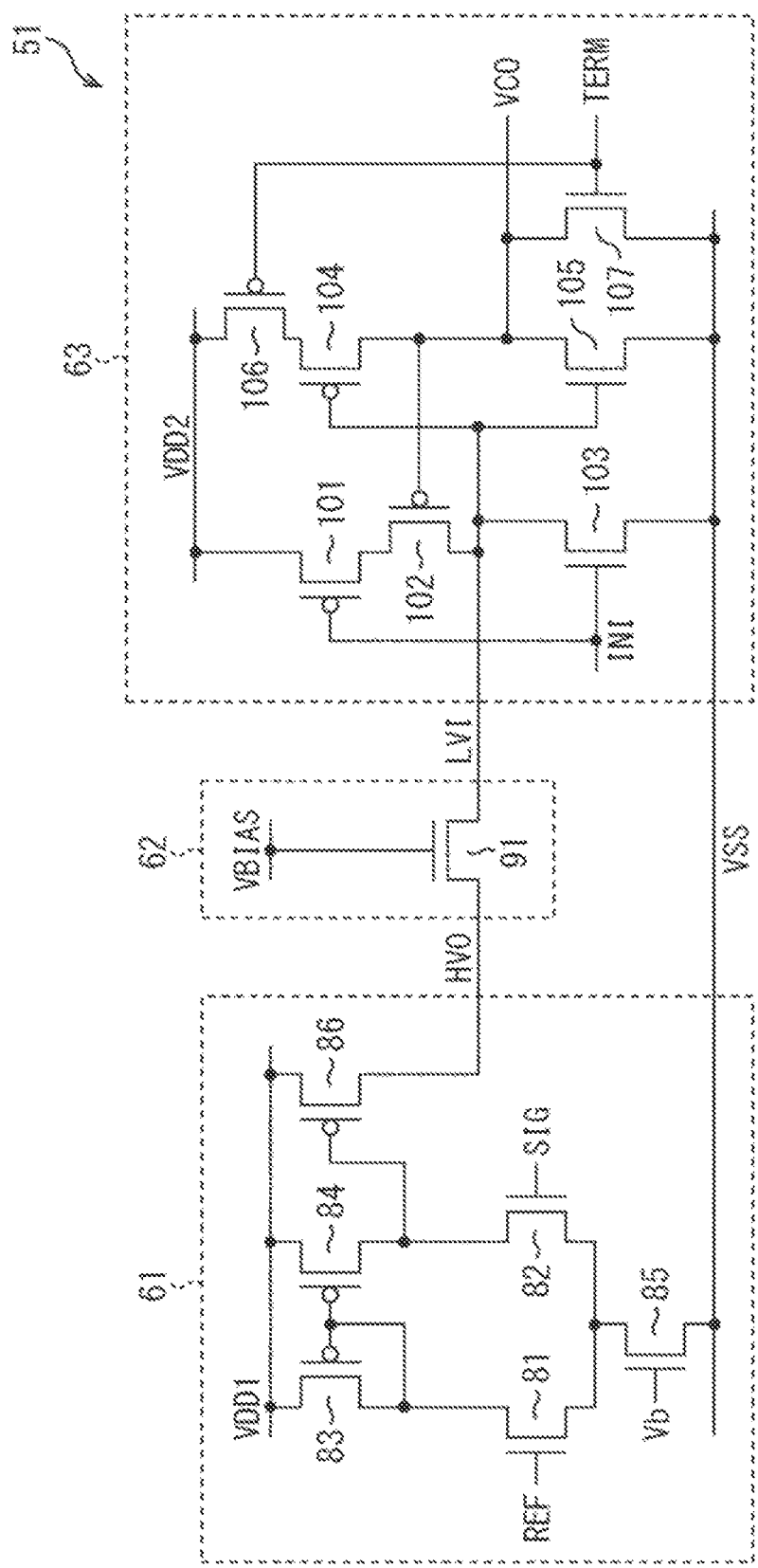
FIG. 3 is a block diagram illustrating a detailed exemplary configuration of a comparison circuit.

FIG. 3 is a circuit diagram illustrating detailed configurations of the differential input circuit 61, the voltage conversion circuit 62, and the positive feedback circuit 63 included in the comparison circuit 51.

The differential input circuit 61 compares the pixel signal SIG output from the pixel circuit 41 in the pixel 21 with the reference signal REF output from the DAC 25, and outputs a predetermined signal (current) when the pixel signal SIG is higher than the reference signal REF.

The differential input circuit 61 includes a differential pair of transistors 81 and 82, transistors 83 and 84 functioning as a current mirror, a transistor 85 as a constant-current source configured to supply current Icm in accordance with input bias current Vb, and a transistor 86 configured to output an output signal of the differential input circuit 61.

The transistors 81, 82, and 85 are negative channel MOS (NMOS) transistors, and the transistors 83, 84, and 86 are positive channel MOS (PMOS) transistors.

Among the differential pair of transistors 81 and 82, the reference signal REF output from the DAC 25 is input to the gate of the transistor 81, and the pixel signal SIG output from the pixel circuit 41 in the pixel 21 is input to the gate of the transistor 82. The sources of the transistors 81 and 82 are connected with the drain of the transistor 85, and the source of the transistor 85 is connected with a predetermined voltage VSS (VSS<VDD2<VDD1).

The drain of the transistor 81 is connected with the gates of the transistors 83 and 84 functioning as a current mirror circuit and the drain of the transistor 83, and the drain of the transistor 82 is connected with the drain of the transistor 84 and the gate of the transistor 86. The sources of the transistors 83, 84, and 86 are connected with a first power voltage VDD1.

The voltage conversion circuit 62 is, for example, an NMOS transistor 91. The drain of the transistor 91 is connected with the drain of the transistor 86 in the differential input circuit 61, the source of the transistor 91 is connected with a predetermined connection point in the positive feedback circuit 63, and the gate of the transistor 86 is connected with a bias voltage VBIAS.

The transistors 81 to 86 included in the differential input circuit 61 are circuits configured to operate at a high voltage up to the first power voltage VDD1, and the positive feedback circuit 63 is a circuit configured to operate at a second power voltage VDD2 lower than the first power voltage VDD1. The voltage conversion circuit 62 converts the output signal HVO input from the differential input circuit 61 into a signal (converted signal) LVI at a low voltage with which the positive feedback circuit 63 can operate, and supplies the signal LVI to the positive feedback circuit 63.

The bias voltage VBIAS may be a voltage that performs conversion into a voltage with which transistors 101 to 105 of the positive feedback circuit 63 configured to operate at a constant voltage are not broken down. For example, the bias voltage VBIAS may be equal to the second power voltage VDD2 of the positive feedback circuit 63 (VBIAS=VDD2).

The positive feedback circuit 63 outputs the comparison result signal, which is inverted when the pixel signal SIG is higher than the reference signal REF, on the basis of the converted signal LVI obtained through conversion from the output signal HVO from the differential input circuit 61 to a signal corresponding to the second power voltage VDD2. Furthermore, the positive feedback circuit 63 increases a transition speed when the output signal VCO output as the comparison result signal is inverted.

The positive feedback circuit 63 includes seven transistors 101 to 107. The transistors 101, 102, 104, and 106 are PMOS transistors, and the transistors 103, 105, and 107 are NMOS transistors.

The source of the transistor 91 as an output end of the voltage conversion circuit 62 is connected with the drains of the transistors 102 and 103 and the gates of the transistors 104 and 105. The source of the transistor 101 is connected with the second power voltage VDD2, the drain of the transistor 101 is connected with the source of the transistor 102, and the gate of the transistor 102 is connected with the drains of the transistors 104 and 105 as an output end of the positive feedback circuit 63.

The sources of the transistors 103, 105, and 107 are connected with the predetermined voltage VSS. The gates of the transistors 101 and 103 are supplied with an initialization signal INI. The gates of the transistors 106 and 107 are supplied with a control signal TERM as a second input, not the converted signal LVI as a first input.

The source of the transistor 106 is connected with the second power voltage VDD2, and the drain of the transistor 106 is connected with the source of the transistor 104. The drain of the transistor 107 is connected with an output end of the comparison circuit 51, and the source of the transistor 107 is connected with the predetermined voltage VSS.

In the comparison circuit 51 configured as described above, the output signal VCO can be set to Lo irrespective of the state of the differential input circuit 61 by setting the control signal TERM as the second input to Hi.

For example, when the voltage of the pixel signal SIG is lower than the final voltage of the reference signal REF due to luminance (for example, an image of the sun photographed in the view angle of the image capturing apparatus 1) higher than expected, the comparison duration ends while the output signal VCO of the comparison circuit 51 is at Hi, and thus the data storage unit 52 controlled by the output signal VCO cannot fix a value nor achieve the AD conversion function.

To prevent the occurrence of such a state, the output signal VCO yet to be inverted to Lo can be forcibly inverted by inputting the control signal TERM of Hi pulse at the last of the sweep of the reference signal REF. The data storage unit 52 stores (latches) a time code right before the forced inversion, and thus, in a case where the configuration illustrated in FIG. 3 is employed, the ADC 42 functions as an AD converter configured to clamp an output value in response to inputting of luminance equal to or higher than certain luminance.

When the bias voltage VBIAS is controlled to the Lo level to cut off the transistor 91 and the initialization signal INI is set to Hi, the output signal VCO becomes Hi irrespective of the state of the differential input circuit 61. Thus, the forced Hi output of the output signal VCO and the forced Lo output of the control signal TERM as described above can be combined to set the output signal VCO to an arbitrary value irrespective of the state of the differential input circuit 61 and the states of the pixel circuit 41 and the DAC 25 therebefore.

With this function, for example, a circuit after the pixel 21 can be tested only by electric signal inputting, independently from optical inputting to the image capturing apparatus 1.

<Detailed Exemplary Configuration of Pixel Circuit>

Figure 4:
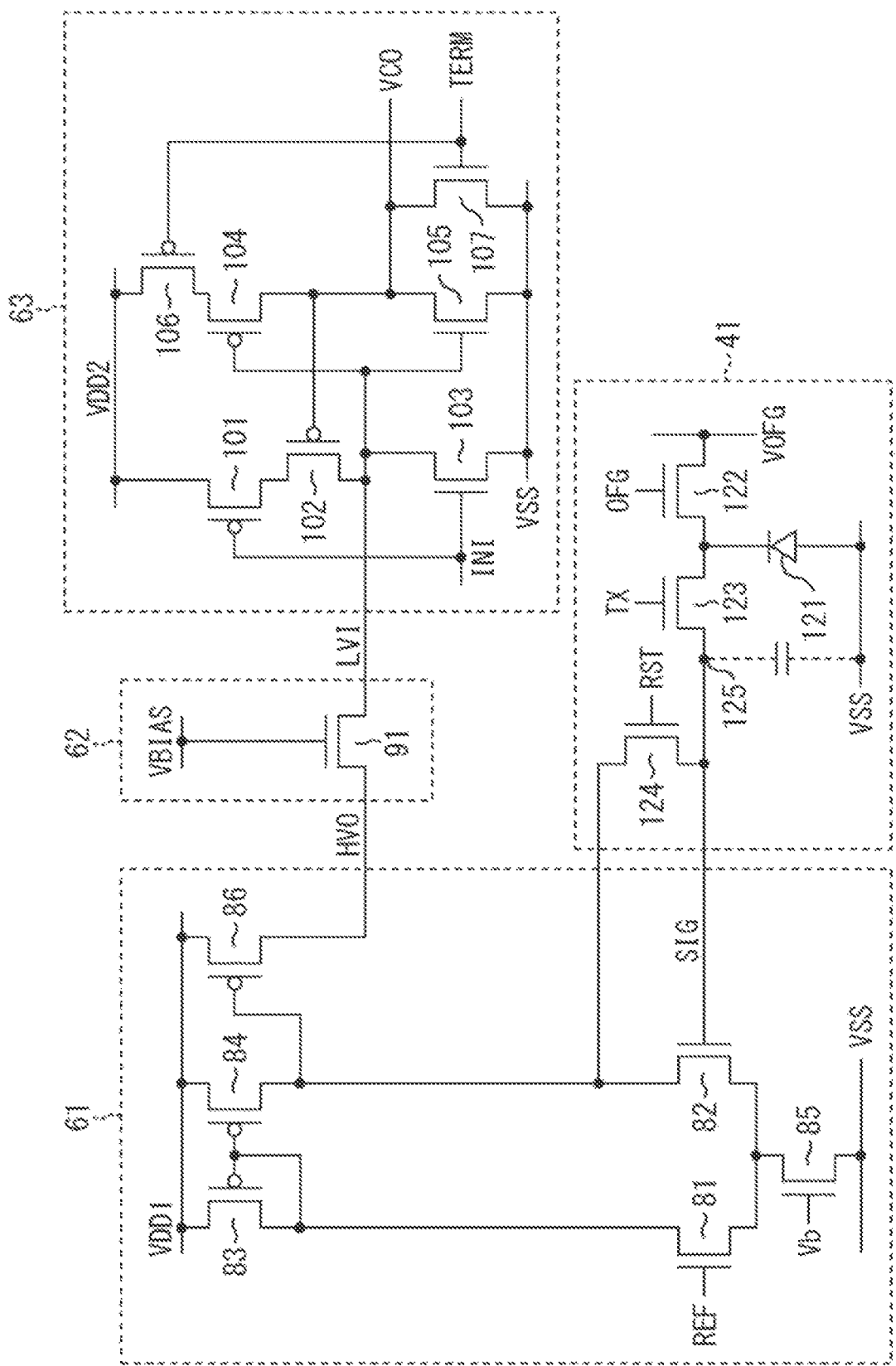
FIG. 4 is a diagram for description of a detailed configuration of a pixel circuit.

The following describes a detailed configuration of the pixel circuit 41 with reference to FIG. 4. FIG. 4 is a circuit diagram illustrating details of the pixel circuit 41 in addition to the differential input circuit 61 of the comparison circuit 51 illustrated in FIG. 3.

The pixel circuit 41 includes a photodiode (PD) 121 as a photoelectric conversion element, a discharge transistor 122, a forwarding transistor 123, a reset transistor 124, and a floating diffusion layer (FD) 125.

The discharge transistor 122 is used to adjust an exposure duration. Specifically, when the discharge transistor 122 is turned on to start the exposure duration at an optional timing, electric charge accumulated in the photodiode 121 so far is discharged. Accordingly, the exposure duration is started when the discharge transistor 122 is turned off.

The forwarding transistor 123 forwards electric charge generated at the photodiode 121 to the FD 125. The reset transistor 124 resets electric charge held by the FD 125. The FD 125 is connected with the gate of the transistor 82 in the differential input circuit 61. With this configuration, the transistor 82 in the differential input circuit 61 functions as an amplification transistor of the pixel circuit 41.

The source of the reset transistor 124 is connected with the gate of the transistor 82 in the differential input circuit 61 and the FD 125, and the drain of the reset transistor 124 is connected with the drain of the transistor 82. Thus, there is no fixed reset voltage for resetting electric charge at the FD 125. This is because the reset voltage for resetting the FD 125 can be optionally set by using the reference signal REF by controlling the circuit state of the differential input circuit 61, and fixed pattern noise of the circuit is stored in the FD 125 to cancel a component of the noise through CDS operation.

<Pixel Timing Chart>

Figure 5:
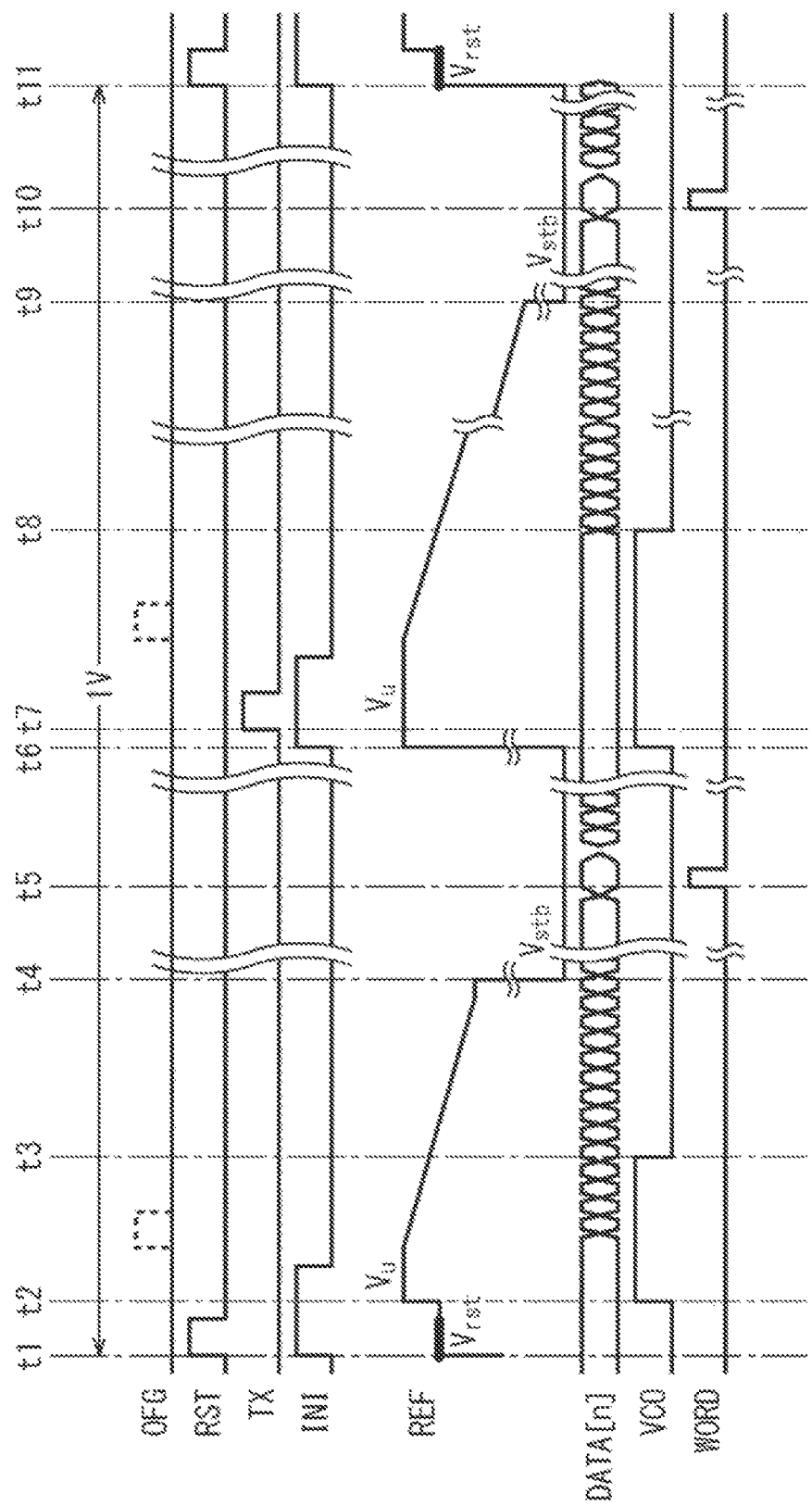
FIG. 5 is a timing chart for description of pixel operation.

The following describes operation of the pixel 21 illustrated in FIG. 4 with reference to a timing chart illustrated in FIG. 5.

Initially, at time t1, the reference signal REF at a standby voltage $V_{stb}$ is set to be a reset voltage $V_{rst}$ for resetting electric charge at the FD 125 to turn on the reset transistor 124, thereby resetting electric charge at the FD 125. Furthermore, at time t1, the initialization signal INI supplied to the gates of the transistors 101 and 103 in the positive feedback circuit 63 is set to Hi, which sets the positive feedback circuit 63 to an initial state.

At time t2, the reference signal REF is raised to a predetermined voltage $V_u$, and comparison between the reference signal REF and the pixel signal SIG (sweep of the reference signal REF) is started. At this stage, the reference signal REF is larger than the pixel signal SIG, and thus the output signal VCO is at Hi.

At time t3 when it is determined that the reference signal REF and the pixel signal SIG have become same, the output signal VCO is inverted (transitions to Low). When the output signal VCO is inverted, the inversion of the output signal VCO is speeded up by the positive feedback circuit 63 as described above. Furthermore, the data storage unit 52 stores time data (DATA [1] to DATA [N] of N bits) when the output signal VCO is inverted.

At time t4 when the signal writing duration ends and the signal reading duration starts, the voltage of the reference signal REF supplied to the gate of the transistor 81 in the comparison circuit 51 is lowered to a level (the standby voltage $V_{stb}$) at which the transistor 81 is turned off. This reduces current consumed at the comparison circuit 51 in the signal reading duration.

At time t5, the WORD signal, which controls the reading timing, becomes Hi, and the latched time signal DATA [0] to DATA [N] of N bits is output from the latch control circuit 71 of the data storage unit 52. The data thus acquired is P phase data of a reset level in correlated double sampling (CDS) processing.

At time t6, the reference signal REF is raised to the predetermined voltage $V_u$, and the initialization signal INI supplied to the gates of the transistors 101 and 103 is set to Hi, which sets the positive feedback circuit 63 to the initial state again.

At time t7, the forwarding transistor 123 in the pixel circuit 41 is turned on by a forwarding signal TX at Hi to forward electric charge generated at the photodiode 121 to the FD 125.

After the initialization signal INI is returned to Low, comparison ( ) between the reference signal REF and the pixel signal SIG sweep of the reference signal REF is started. At this stage, the reference signal REF is larger than the pixel signal SIG, and thus the output signal VCO is at Hi.

Then, at time t8 when it is determined that the reference signal REF and the pixel signal SIG have become same, the output signal VCO is inverted (transitions to Low). When the output signal VCO is inverted, the inversion of the output signal VCO is speeded up by the positive feedback circuit 63. Furthermore, the data storage unit 52 stores time data (DATA [1] to DATA [N] of N bits) when the output signal VCO is inverted.

At time t9 when the signal writing duration ends and the signal reading duration starts, the voltage of the reference signal REF supplied to the gate of the transistor 81 in the comparison circuit 51 is lowered to a level (the standby voltage $V_{stb}$) at which the transistor 81 is turned off. This reduces current consumed at the comparison circuit 51 in the signal reading duration.

At time t10, the WORD signal, which controls the reading timing, becomes Hi, and the latched time signal DATA [0] to DATA [N] of N bits is output from the latch control circuit 71 of the data storage unit 52. The data thus acquired is D phase data of a signal level in CDS processing. The state at time t11 is same as the state at time t1 described above, and corresponds to drive of the next 1 V (1 vertical scanning duration).

According to the above-described drive of the pixel 21, the P phase data (reset level) is first acquired and then read, and subsequently, the D phase data (signal level) is acquired and read.

Through the above-described operation, all pixels 21 of the pixel array unit 22 of the image capturing apparatus 1 can perform global shutter operation of simultaneously resetting all pixels and simultaneously exposing all pixels. Since all pixels can be simultaneously exposed and read, it is unnecessary to provide a holding unit that is typically provided in each pixel and configured to hold electric charge until the electric charge is read. Furthermore, the configuration of the pixel 21 does not require, for example, a selection transistor for selecting a pixel that outputs the pixel signal SIG, which is needed in a column-parallel reading image capturing apparatus.

In the drive of the pixel 21 described with reference to FIG. 5, the discharge transistor 122 is constantly controlled to be off. However, an optional exposure duration can be set by setting a discharge signal OFG to Hi to temporarily turn on the discharge transistor 122 at a desired time and then turning off the discharge transistor 122 as illustrated with a dashed line in FIG. 5.

<Noise>

The noise level of the image capturing apparatus 1 (FIG. 1) is defined by thermal noise, 1/f noise, and quantization noise. The gm of a circuit may be improved to reduce the thermal noise, but this increases current consumed at an analog circuit, which potentially increases electrical power.

Furthermore, the 1/f noise is sensitive to current but mainly determined by an area and a process, and their measurement potentially leads to cost increase. The quantization noise is uniquely determined by the resolution of the ADC 42, but at low illuminance, is defined by random noise (thermal noise and 1/f noise) of an image sensor and the quantization noise of the ADC 42. The thermal noise and the 1/f noise depend on the amount of current consumed at an analog circuit.

The following describes the image capturing apparatus 1 capable of achieving low electrical power at high illuminance and low noise at low illuminance by adaptively adjusting current consumed an analog circuit in a variable manner on the basis of an AD converted output signal (output signal from the ADC 42).

Figure 6:
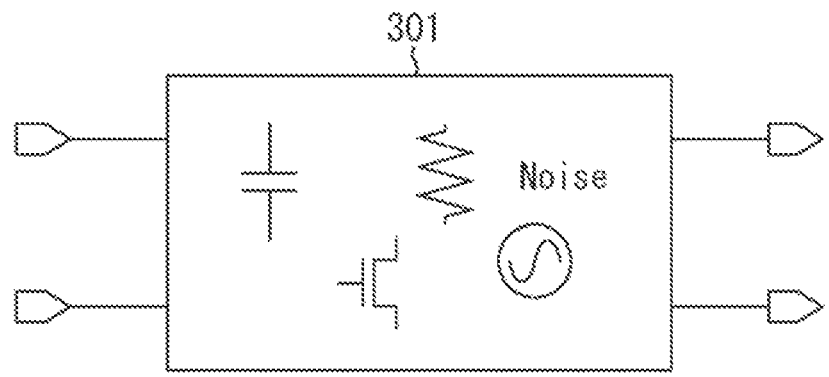
FIG. 6 is a diagram for description of the configuration of a circuit having noise.

In the following, noise is illustrated as follows, and description is made. As illustrated in FIG. 6, a predetermined circuit 301 is a circuit having noise. Noise occurs from, for example, a resistor element, a capacitor element, and a transistor element in the circuit 301. Assume that external control to reduce noise is performed on the circuit 301 including an element that potentially generates noise.

Figure 7:
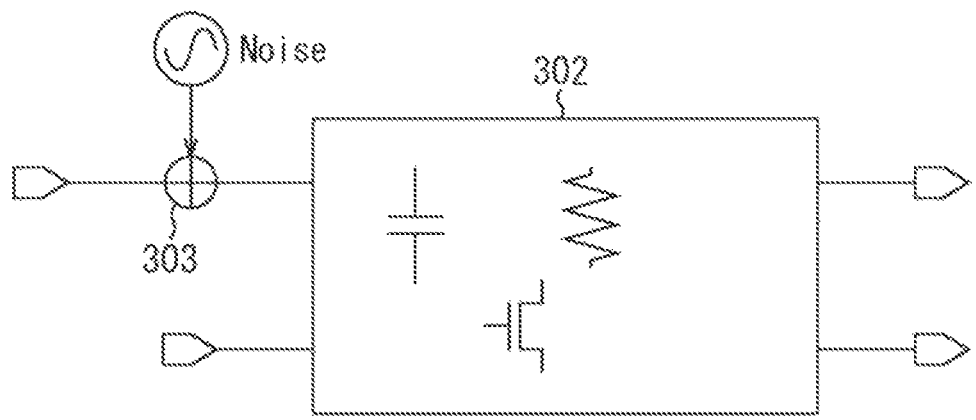
FIG. 7 is a diagram for description of the configuration of a circuit having noise.

In this case, the following description is made by performing description that input conversion of noise is equivalently performed, a predetermined amount of noise is input, and a circuit 302 is noiseless as illustrated in FIG. 7. In a circuit diagram illustrated in FIG. 7, the circuit 302 is a circuit that does not generate noise, an addition unit 303 is provided outside of the circuit 302, and a predetermined amount of noise is input to the addition unit 303. The addition unit 303 is connected with the circuit 302, and as a result, noise is supplied to the circuit 302.

Figure 8:
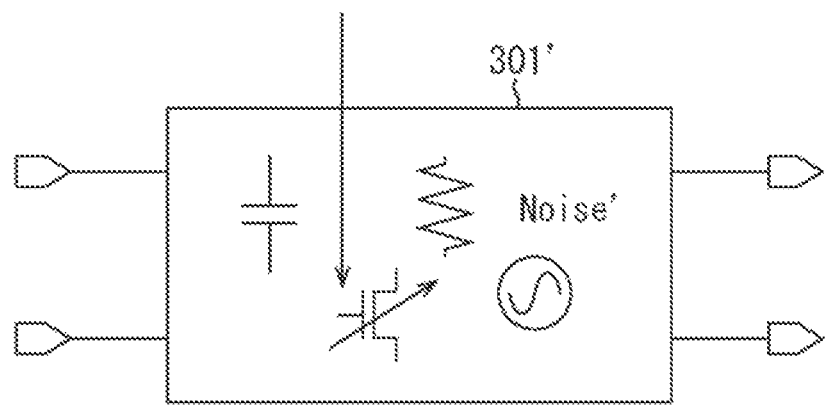
FIG. 8 is a diagram for description of the configuration of a circuit having noise.

Referring to the circuit 301 illustrated in FIG. 6 again, the amount of noise is changed, for example, when current flowing to a transistor element included in the circuit 301 is changed. In other words, the amount of noise can be controlled by controlling the current flowing to the transistor element. Thus, noise of a circuit 301' (the prime mark is attached to distinguish the circuit 301 illustrated in FIG. 6) can be controlled by controlling current flowing to a transistor element in the circuit 301' as illustrated in FIG. 8.

Figure 9:
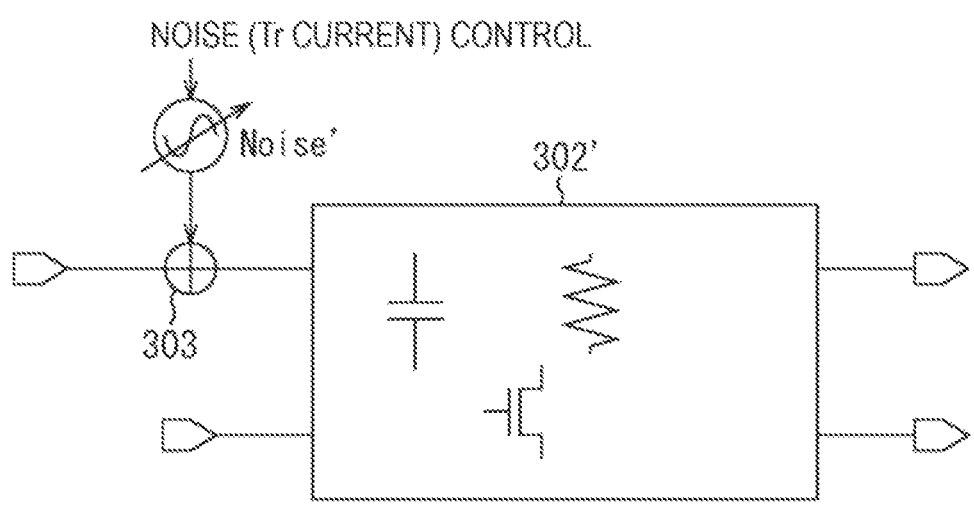
FIG. 9 is a diagram for description of the configuration of a circuit having noise.

FIG. 9 illustrates this control with the noiseless circuit 302 illustrated in FIG. 7. Specifically, as illustrated in FIG. 9, noise of the circuit 302' can be controlled by controlling the amount of noise input to a noiseless circuit 302' (the amount of noise input to the addition unit 303).

As described above, noise such as thermal noise, 1/f noise, and quantization noise occurs to the image capturing apparatus 1. The ADC 42 included in the image capturing apparatus 1 includes, for example, a plurality of transistor elements as illustrated in FIG. 3. Description will be made on the image capturing apparatus 1 configured to control the amount of noise generated at the ADC 42 by controlling current flowing to these transistor elements and perform image capturing at improved image quality.

<Configuration of Image Capturing Apparatus Configured to Perform Noise Control>

Figure 10:
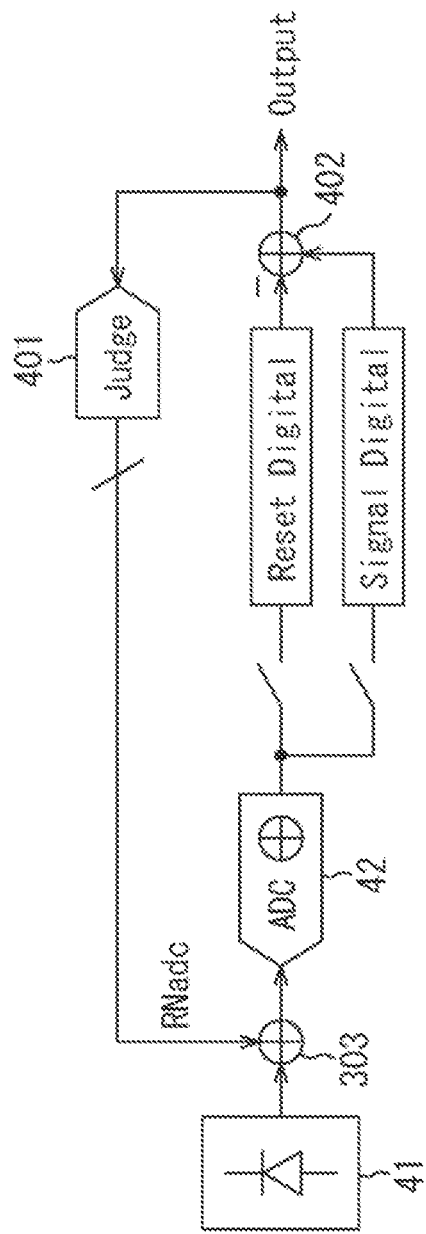
FIG. 10 is a diagram for description of the configuration of a circuit including a determination unit.

FIG. 10 is a diagram illustrating the configuration of an image capturing apparatus configured to perform noise control, in particular, the configurations of the ADC 42 having a configuration for controlling the amount of noise generated at the ADC 42 and peripheral circuits. To control the amount of noise generated at the ADC 42, the configuration includes a determination unit 401 configured to perform determination as described later on the basis of an output from the ADC 42.

As a result of the determination by the determination unit 401, the amount of noise supplied to the ADC 42 is controlled. As described later, the amount of noise is controlled by controlling current flowing to a predetermined transistor element in the ADC 42. The determination unit 401 functions as a control unit configured to control current in the ADC 42.

The output from the ADC 42 is reset digital data and signal digital data. A signal of electric charge accumulated in the pixel circuit 41 (the photodiode 121 therein) is generated when the difference between the reset digital data and the signal digital data is calculated by an addition unit 402, and output as an output signal.

The output signal is input to the determination unit 401, and the determination unit 401 determines a property of a captured image such as high illuminance or low illuminance and controls the amount of noise in accordance with a result of the determination as described later in detail.

Figure 11:
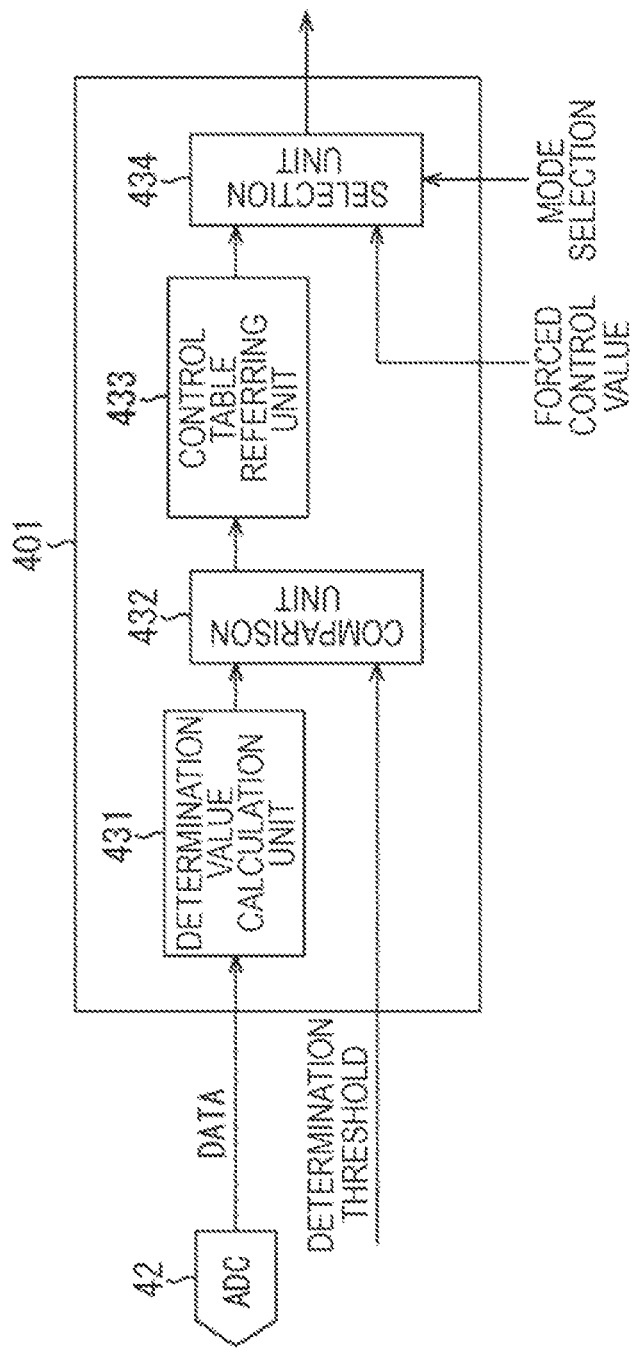
FIG. 11 is a diagram for description of the configuration of the determination unit.

FIG. 11 is a diagram illustrating an exemplary configuration of the determination unit 401. The determination unit 401 includes a determination value calculation unit 431, a comparison unit 432, a control table referring unit 433, and a selection unit 434.

A pixel signal output from the ADC 42 is supplied to the determination value calculation unit 431 of the determination unit 401. The supplied pixel signal may be the pixel value of the entire pixel area, the pixel value of one pixel, a pixel value representing at least one pixel, or the like.

The at least one pixel may be, for example, a pixel disposed in a predetermined region of the pixel array unit or an image plane phase difference pixel. Furthermore, such a pixel may be a representative pixel of pixels in a region around the pixel, and a signal from the representative pixel may be read earlier than a signal from a pixel other than the representative pixel. Then, the signal read from the representative pixel may be used to perform the determination by the determination unit 401.

The unit of pixel signals input to the determination value calculation unit 431 may be equal to the unit of control. For example, pixel signals are supplied in the unit of one pixel in a case where control is performed in the unit of one pixel.

In other words, the accuracy of the determination by the determination unit 401 may be the entire pixel area, the unit of each pixel, or the unit of a plurality of pixels.

The unit of pixel signals input to the determination value calculation unit 431 may be, for example, each pixel, each column, each pixel block of a predetermined number of pixels, or all pixels.

Furthermore, for example, the timing of control (timing at which the determination is performed) such as a timing at which a pixel signal is input to the determination value calculation unit 431 or a timing at which the determination is performed by the determination unit 401 may be performed constantly (performed in each frame) or may be performed in each predetermined number of frames.

Note that the timing at which the determination is performed by the determination unit 401 may be different from a timing at which, for example, a current value is controlled by using a result of the determination, as described later. In the following description, the timing at which the determination is performed is the timing of control.

Furthermore, in a case where a single image is generated by a plurality of frames (subframes), control may be performed in each subframe or may be performed in a predetermined subframe among the subframes.

For example, in a case where one frame is generated by using four subframes, control may be performed in each subframe or may be performed in a predetermined subframe among the four subframes, for example, the first subframe (control by using a value of the predetermined subframe is performed in the other subframes).

The determination value calculation unit 431 calculates, for example, an average value, a representative value, or a maximum value indicating whether saturation occurs in a screen by using an input pixel signal. All values may be calculated, or at least one of the values may be calculated.

Note that a determination value calculated by the determination value calculation unit 431 may be calculated by using a pixel signal provided with processing such as defect correction in advance.

The determination value from the determination value calculation unit 431 is supplied to the comparison unit 432. The comparison unit 432 is also supplied with a determination threshold. The determination threshold may be supplied from the outside of the determination unit 401, or may be held or generated by the comparison unit 432. The determination threshold may be a fixed value or a variable value that takes a different value depending on a predetermined condition.

The comparison unit 432 compares the determination value from the determination value calculation unit 431 with the determination threshold, and supplies a result of the comparison to the control table referring unit 433. The control table referring unit 433 refers to a table of a control signal for noise control of an analog circuit, for example, a current value. The table is, for example, a table in which a result of the comparison is associated with a current value.

The table may be held inside the control table referring unit 433, or may be held outside the control table referring unit 433.

The selection unit 434 is supplied with a reference value (for example, a current value) from the reference table referring unit 433, a forced control value, and a mode selection signal. The selection unit 434 determines whether or not to perform forced control on the basis of the mode selection signal, and as a result of the determination, selects any one of the reference value from the reference table referring unit 433 or the forced control value, and supplies a result of the selection to each analog circuit, for example, the ADC 42.

<First Configuration of Controlling Current in Differential Input Circuit>

Figure 12:
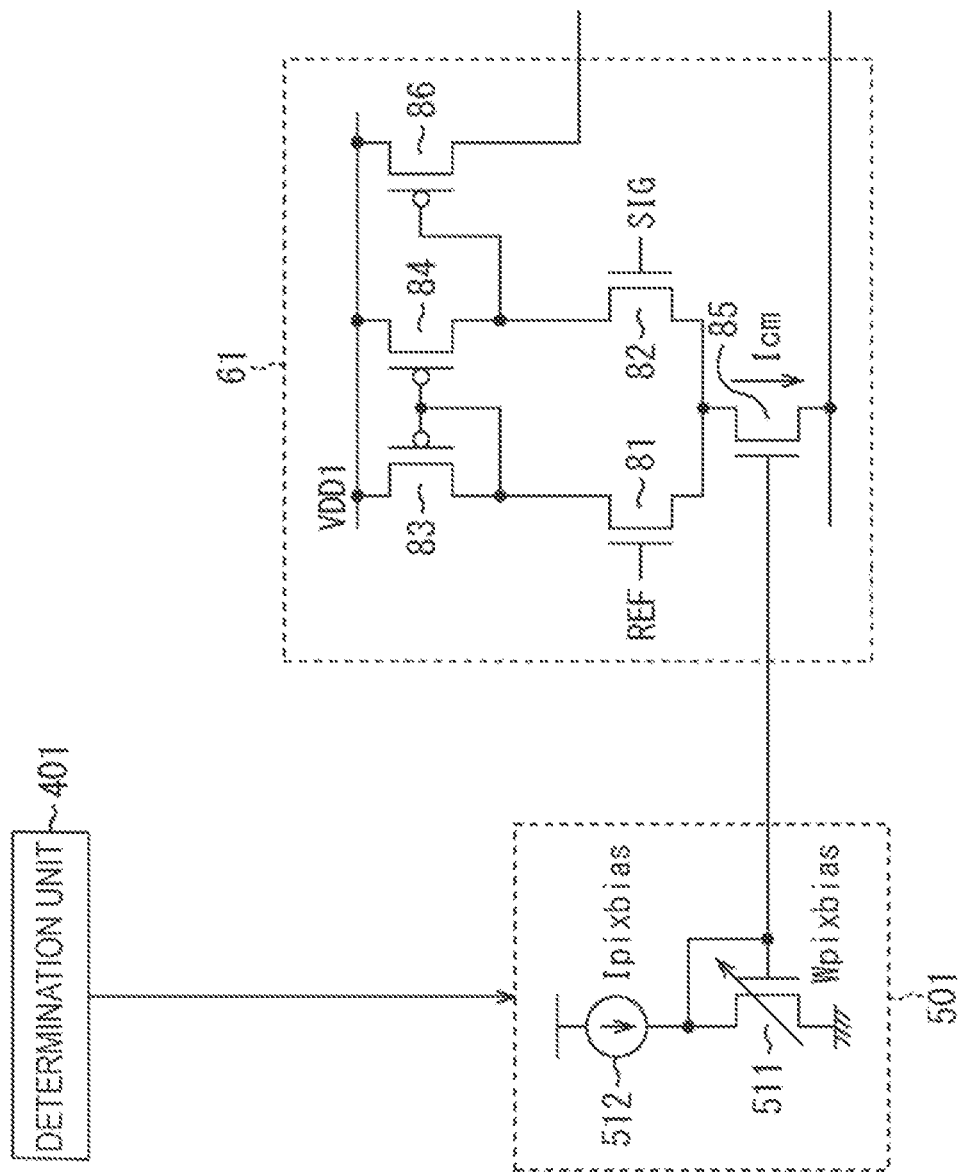
FIG. 12 is a diagram for description of the configuration of a bias circuit.

FIG. 12 illustrates an exemplary configuration of the ADC 42 and a peripheral part thereof in a case where current flowing to the transistor element in the ADC 42 is controlled on the basis of the determination result from the determination unit 401. FIG. 12 only illustrates the differential input circuit 61 in the ADC 42. A bias circuit 501 configured to control the current Icm flowing to the transistor 85 in the differential input circuit 61 is connected with the gate of the transistor 85.

The bias circuit 501 is supplied with the determination result from the determination unit 401. The bias circuit 501 includes a plurality of transistors 511 and a current source 512. The bias circuit 501 can change a current value of the connected differential input circuit 61 by changing a plurality of transistors used among the transistors 511.

In a case where current flowing to the bias circuit 501 is denoted by current Ipixbias, a channel length L of each transistor 511 is fixed, a channel width W (W size of bias) of the transistor 511 is denoted by Wpixbias, and the W size of the current source of the pixel is denoted by Wcmbias, the current Icm flowing to the transistor 85 is given by:
Icm=Ipixbias×(Wcmbias/Wpixbias).

Thus, control is possible by using a characteristic that a current density per unit W is constant. When this current value is an order of magnitude [nA] on the differential input circuit 61 side, operation is possible due to a configuration (positive feedback configuration) including the positive feedback circuit 63 at a later stage.

In this manner, noise generated by a transistor (in this example, the transistor 85) (entire circuit including the transistor 85) in the differential input circuit 61 can be controlled by controlling current flowing to the transistor 85.

For example, in a case where a bright image (high illuminance image) is captured, it is thought that influence of noise on the image quality is small when the noise is large. Furthermore, in a case where a dark image (low illuminance image) is captured, it is thought that influence of noise on the image quality is large when the noise is large.

Furthermore, noise also depends on a current value flowing to a transistor, and tends to reduce as the current value increases.

Thus, when it can be determined that a high illuminance image is captured, the determination unit 401 outputs a determination value for controlling the current value of the differential input circuit 61 (the transistor 85 therein) to be low to the bias circuit 501, and the bias circuit 501 performs control to reduce the current value in the differential input circuit 61. Accordingly, low electrical power consumption can be achieved when a high illuminance image is captured.

Furthermore, when it can be determined that a low illuminance image is captured, the determination unit 401 outputs a determination value for controlling the current value of the differential input circuit 61 (the transistor 85 therein) to be high to the bias circuit 501, and the bias circuit 501 performs control to increase the current value in the differential input circuit 61. Accordingly, noise can be reduced when a low illuminance image is captured.

<Second Configuration of Controlling Current in Differential Input Circuit>

Figure 13:
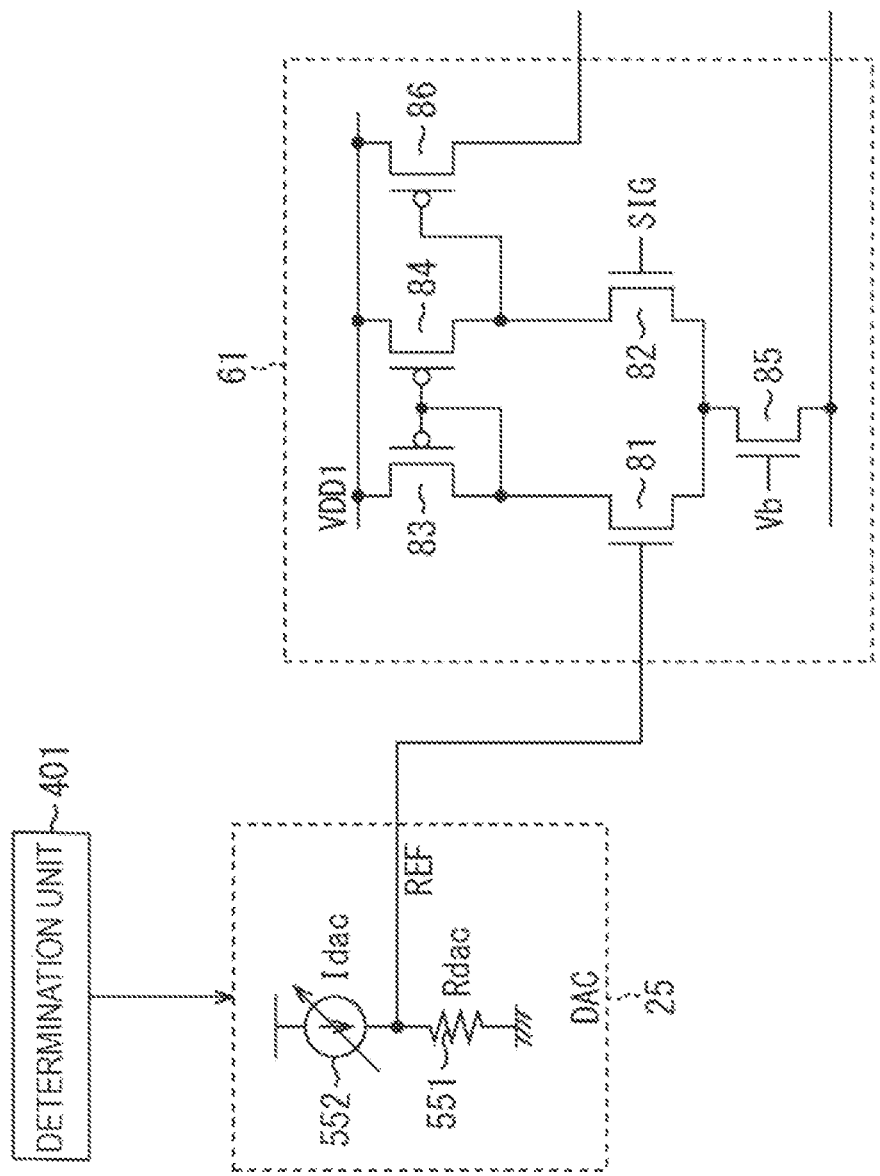
FIG. 13 is a diagram for description of the configuration of a DAC.

FIG. 13 illustrates a second exemplary configuration of the ADC 42 and a peripheral part thereof in a case where current flowing to the transistor element in the ADC 42 is controlled based on the determination result from the determination unit 401. FIG. 13 only illustrates the differential input circuit 61 in the ADC 42. The DAC 25 configured to control the reference signal REF supplied to the transistor 81 in the differential input circuit 61 is connected with the gate of the transistor 81.

The DAC 25 generates the reference signal (reference voltage signal) REF as a slope signal having a level (voltage) that monotonically decreases as time elapses, and supplies the generated reference signal REF to each pixel 21 as described above.

The DAC 25 is supplied with the determination result from the determination unit 401. The DAC 25 includes a resistor 551 and a current source 552. For example, when the current source 552 includes a plurality of current sources, the DAC 25 controls a current value from the current source 552 by performing control to individually turn on and off the plurality of current sources.

The DAC 25 has a reference potential at ground (GND), and the DAC waveform (waveform of the reference signal REF) is determined by IR drop of current flowing to the resistor 551. Typically, it is known that, as current increases, current shot noise increases and noise of the DAC 25 degrades. With the voltage range of the FD 125 (FIG. 4) taken into consideration, current is entirely reduced by a constant amount in the DAC waveform as illustrated in FIG. 14, for example, in a case where a signal amount is small.

Figure 14:
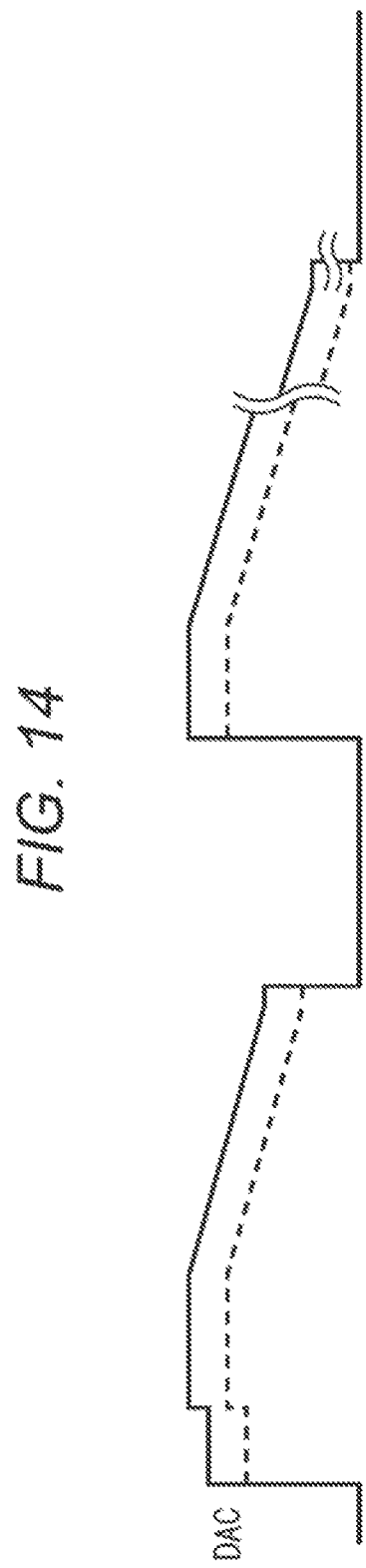
FIG. 14 is a diagram for description of the waveform of a signal output from the DAC.

In FIG. 14, a solid line illustrates the waveform of the reference signal REF in normal operation, and a dotted line illustrates the waveform of the reference signal REF when current is uniformly reduced. In this manner, noise generated at the DAC 25 can be reduced by providing an offset to the reference signal REF.

In this example, description is made in a DC manner, but, for example, uniform change with an offset may be performed in accordance with a gain (slope gradient). Furthermore, the DC value of the initial voltage of the FD 125 can be reduced as illustrated with the dotted line in FIG. 14, and thus dark current of the FD 125 can be reduced, and shot noise due to the dark current of the FD 125 can be reduced. Accordingly, random noise can be further reduced.

Thus, in a case of a low luminance signal (low signal level), control is performed to reduce the current value and set the initial voltage of the FD 125 of the pixel to be low, thereby reducing dark current shot noise. However, in a case of a high luminance signal (high signal level), control is performed to increase the current and set the voltage of the FD 125 to be high so that a high luminance signal can be obtained.

In this case, the dark current shot noise potentially increases, but does not appear to be significant due to high luminance. Furthermore, the single DAC 25 is provided for all pixels and does not consume electrical power as much as the differential input circuit 61, and thus reduction of current in the differential input circuit 61 results in low electrical power consumption. For example, in a case of 10 M pix of pixels, an effect 10 M times larger can be obtained.

<Third Configuration of Controlling Current in Differential Input Circuit>

Figure 15:
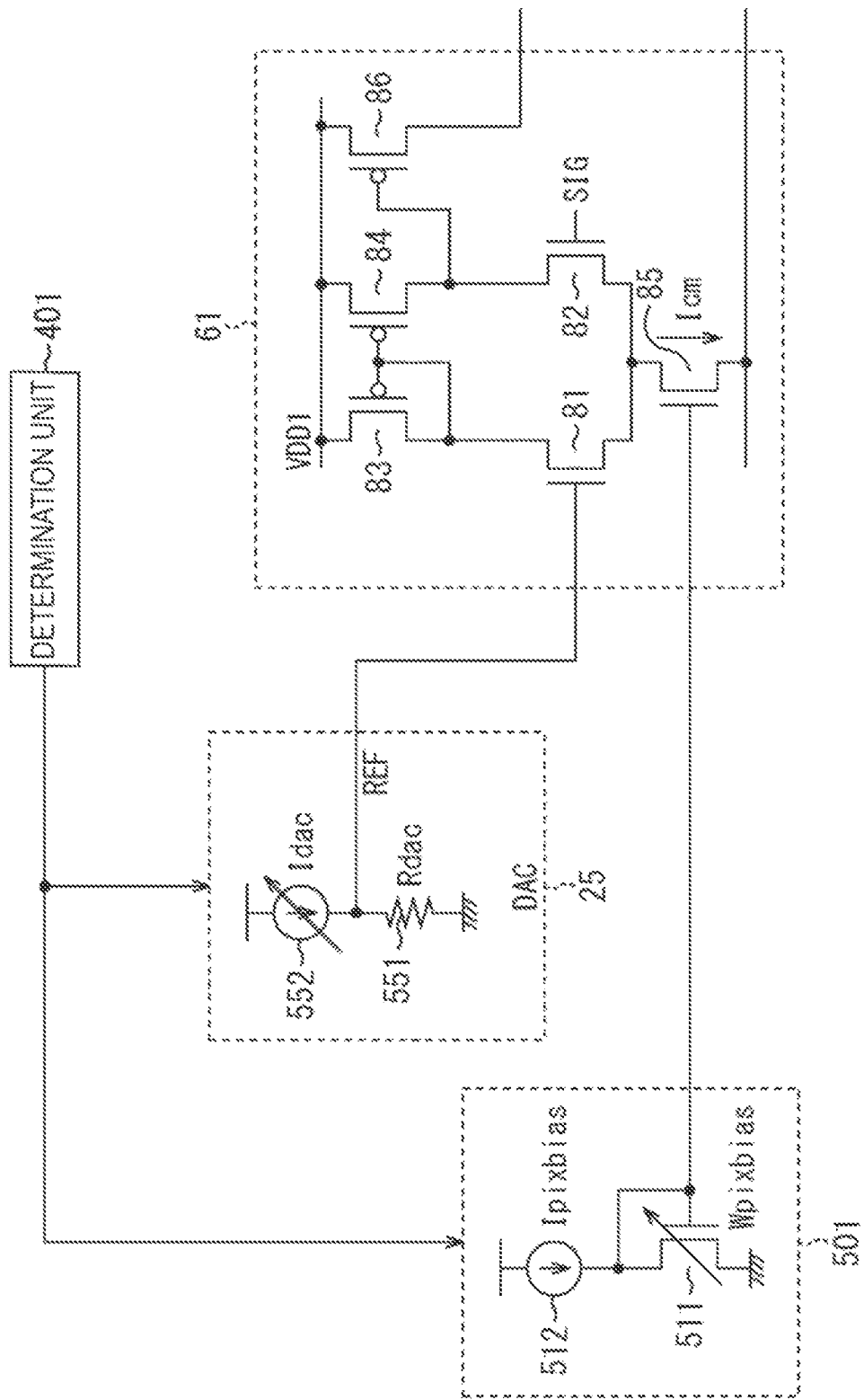
FIG. 15 is a diagram for description of the configuration of the bias circuit and the DAC.

The first configuration of controlling current in the differential input circuit illustrated in FIG. 12 and the second configuration of controlling current in the differential input circuit illustrated in FIG. 13 may be combined with each other. FIG. 15 illustrates an exemplary configuration of the ADC 42 and a peripheral part thereof in the combination of the first configuration and the second configuration.

In the ADC 42 illustrated in FIG. 15, the bias circuit 501 configured to control current flowing to the transistor 85 in the differential input circuit 61 is connected with the gate of the transistor 85. Furthermore, the DAC 25 configured to control the reference signal REF supplied to the transistor 81 in the differential input circuit 61 is connected with the gate of the transistor 81.

The bias circuit 501 and the DAC 25 are each supplied with the determination result from the determination unit 401. Control performed by the bias circuit 501 and the DAC 25 is similar to that in the case described above.

Specifically, in a case where it is determined by the determination unit 401 that a signal value is a low luminance signal (having a low signal level) to be resistant against noise, the bias circuit 501 performs feedback of a current value to an analog circuit (such as the ADC 42), which leads to noise reduction. In a case of the differential input circuit 61, control is performed to increase the current value of the current Icm flowing in the differential input circuit 61 and reduce thermal noise generated by the circuit.

In a case of the DAC 25, control is performed to reduce dark current shot noise by reducing a current value and setting a low initial voltage to the FD 125 of the pixel.

At high illuminance, the bias circuit 501 performs control to reduce the current of the current Icm in the differential input circuit 61. In this case, noise is increased, but low electric power consumption of the differential input circuit 61 is achieved. Unlike the bias circuit 501, the DAC 25 performs control to increase the current and set a high voltage to the FD 125 to acquire a high illuminance signal.

With such a configuration, current flowing to the differential input circuit 61 can be controlled to control noise. Furthermore, noise can be more appropriately controlled by individually controlling current flowing to a plurality of transistors in the differential input circuit 61.

<Control Application Timing>

As described above, noise in the ADC 42 is controlled on the basis of a result of the determination by the determination unit 401. The following describes a timing at which the result of the determination by the determination unit 401 is output and a timing at which the result of the determination is applied with reference to FIG. 16.

The pixel 21 starts exposure at a predetermined timing. In the drive of the pixel 21 described with reference to FIG. 5, the discharge transistor 122 is constantly controlled to be off. However, as illustrated with a dashed line in FIG. 5, it is possible to set an optional exposure duration by setting the discharge signal OFG to Hi to temporarily turn on the discharge transistor 122 and then turning off the discharge transistor 122 at a desired time, and for example, the start of exposure can be defined by a falling pulse of OFG (FIG. 5).

An exposure time is defined to be from the exposure start until the falling time of the forwarding signal TX (FIG. 5). In a case where the one ADC 42 is used by one pixel, they have 1:1 correspondence, but the exposure time can be individually set (pixel sharing will be described later) in a case where the FD 125 is shared by a plurality of pixels to use the one ADC 42.

The exposure duration includes a RST (reset) duration in which initialization of the FD 125 and AutoZero of the comparison circuit 51 (FIG. 2) are performed, and preparation for starting processing at the ADC 42 is performed. Thereafter, initialization of a positive feedback circuit (PSB) 63 is performed, and simultaneously, the initial voltage of the DAC 25 is set.

A duration after the reset duration is a P phase acquisition duration (hereinafter simply referred to as, for example, the P phase or the P phase acquisition duration) that is the duration of A/D conversion of the reset level of the pixel. The voltage of the DAC 25 is gradually decreased, and data is written to the latch storage unit 72 (FIG. 2). When a signal input to the differential input circuit 61 from the pixel circuit 41 and a signal from the DAC 25 have a same value (same voltage), the output from the comparison circuit 51 is inverted, and writing data to the latch storage unit 72 is written.

Note that, although the above describes the example in which the positive feedback circuit 63 is provided as a circuit for speeding up response, any other circuit configured to achieve a similar function (of storing latch data in a predetermined time) is applicable.

Data acquired in the P phase acquisition duration is output from the ADC 42 in a P phase output duration.

A D phase acquisition duration (hereinafter simply referred to as, for example, the D phase or the D phase acquisition duration) that is the duration of A/D conversion of the signal level of the pixel is provided after the P phase output duration. In the D phase acquisition duration, the forwarding transistor 123 (FIG. 4) is turned on, and a signal from the photodiode 121 is forwarded to the FD 125. The voltage of the DAC 25 is gradually decreased, and a time code from the time code forwarding unit 23 is supplied to the latch control circuit 71 (FIG. 2).

When the signal input to the differential input circuit 61 from the pixel circuit 41 and the signal from the DAC 25 have a same value (same voltage), the output from the comparison circuit 51 is inverted, and a time code at that time is written to the latch storage unit 72.

When the signal (slope) from the DAC 25 is decreased to a GND level (voltage at which pixel current is off), electrical power consumed at the ADC 42 in the pixel 21 becomes a zero state to achieve a standby state.

However, data acquired in the D phase acquisition duration is output from the ADC 42 in the D phase output duration.

A processing unit (not illustrated) configured to process a signal from the ADC 42 performs removal of fixed pattern noise, reset noise of the FD 125, and reset noise of a circuit by performing CDS of the P phase data and the D phase data.

In this case, finally remaining noises are thermal noise, 1/f noise, and random telegraph signal (RTS) noise, which are determined by a current value flowing through an analog circuit in operation. To control these noises, a current value in a circuit (the ADC 42) is controlled in accordance with an output signal level as described above to reduce the noises.

Figure 16:
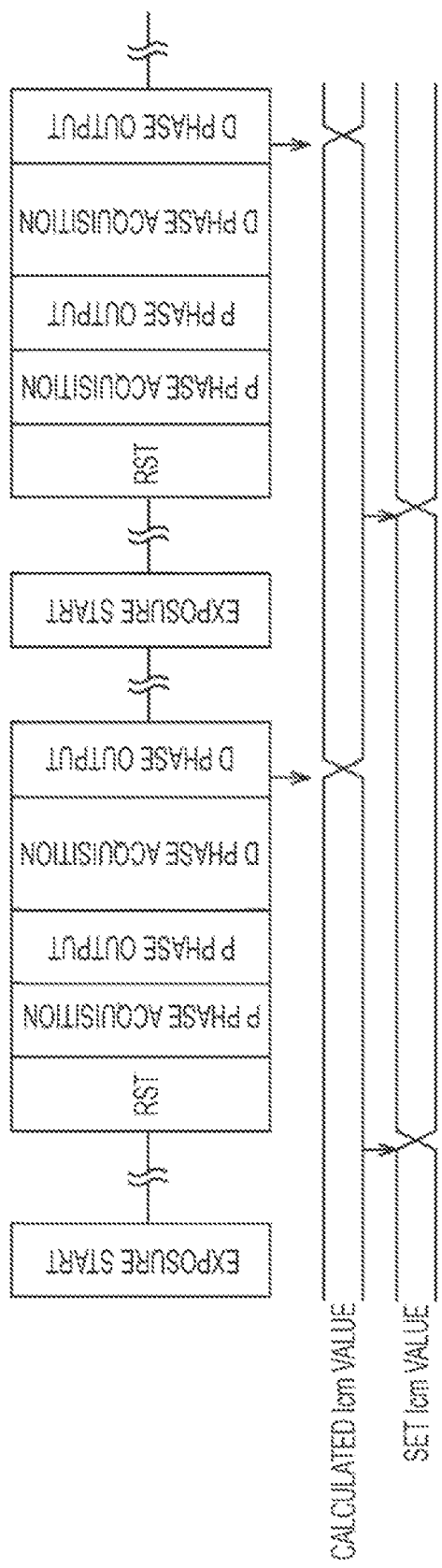
FIG. 16 is a diagram for description of control timing.

The timing of controlling noise in accordance with the output signal level is, for example, a timing as illustrated in FIG. 16. Note that, in the following, description is made with an example of noise control by the bias circuit 501.

Signals from all pixels may be read, the average value of the signals may be calculated, and the amount of current flowing to a predetermined transistor in the ADC 42 may be calculated from the average value. Furthermore, part of the D phase output may be read, the luminance value thereof may be determined, and a current value (bias value) in the next frame may be calculated.

In FIG. 16, in the D phase output duration, the current value Icm is calculated by the determination unit 401, and the calculated current value Icm is applied into an analog circuit, for example, the differential input circuit 61 in the ADC 42 before the reset duration after the start of exposure in the next frame.

Note that, in the P phase output duration, the current value Icm may be calculated, and the calculated current value Icm may be applied to the D phase acquisition duration of the same frame. However, in this case, data to which different current values Icm are applied is used in the P phase and the D phase in the same frame, and noise potentially cannot be appropriately removed in CDS of the P phase data and the D phase data.

Thus, as described above, in the D phase output duration, the current value Icm is calculated, and the calculated current value Icm is applied before the reset duration after the start of exposure in the next frame, in other words, in the P phase acquisition duration and the D phase acquisition duration in the next frame.

Note that the current value Icm may be calculated in the P phase output duration, and the calculated current value Icm may be applied in the P phase acquisition duration and the D phase acquisition duration of the next frame.

The following additionally describes the calculation of the current value Icm. The description is made with an example in which a maximum output value is 14 bits (0 to 16383). In a case where output after CDS is smaller than 4096 for eight frames, it is determined that a processing target (captured) image is dark, drive is performed to increase a set value of the current value Icm for improving noise on the low illuminance side.

However, in a case where the output after CDS is larger than 4096 for eight frames, it is regarded that a large number of high illuminance signals are included, it is determined that the image is a bright image from which an image in which shot noise is dominant is potentially acquired, and drive is performed to reduce setting of the current value Icm.

A configuration with which the screen does not flicker near the threshold of 4096 may be achieved by providing hysteresis in this manner. Note that the above description is made on the example with eight frames, but any other number of frames is applicable.

<Sharing Pixel Structure>

In the embodiment described above, the comparison circuit 51 has a configuration in which one ADC 42 is disposed in one pixel 21, but may have a configuration in which one ADC 42 is shared by a plurality of pixels 21.

Figure 17:
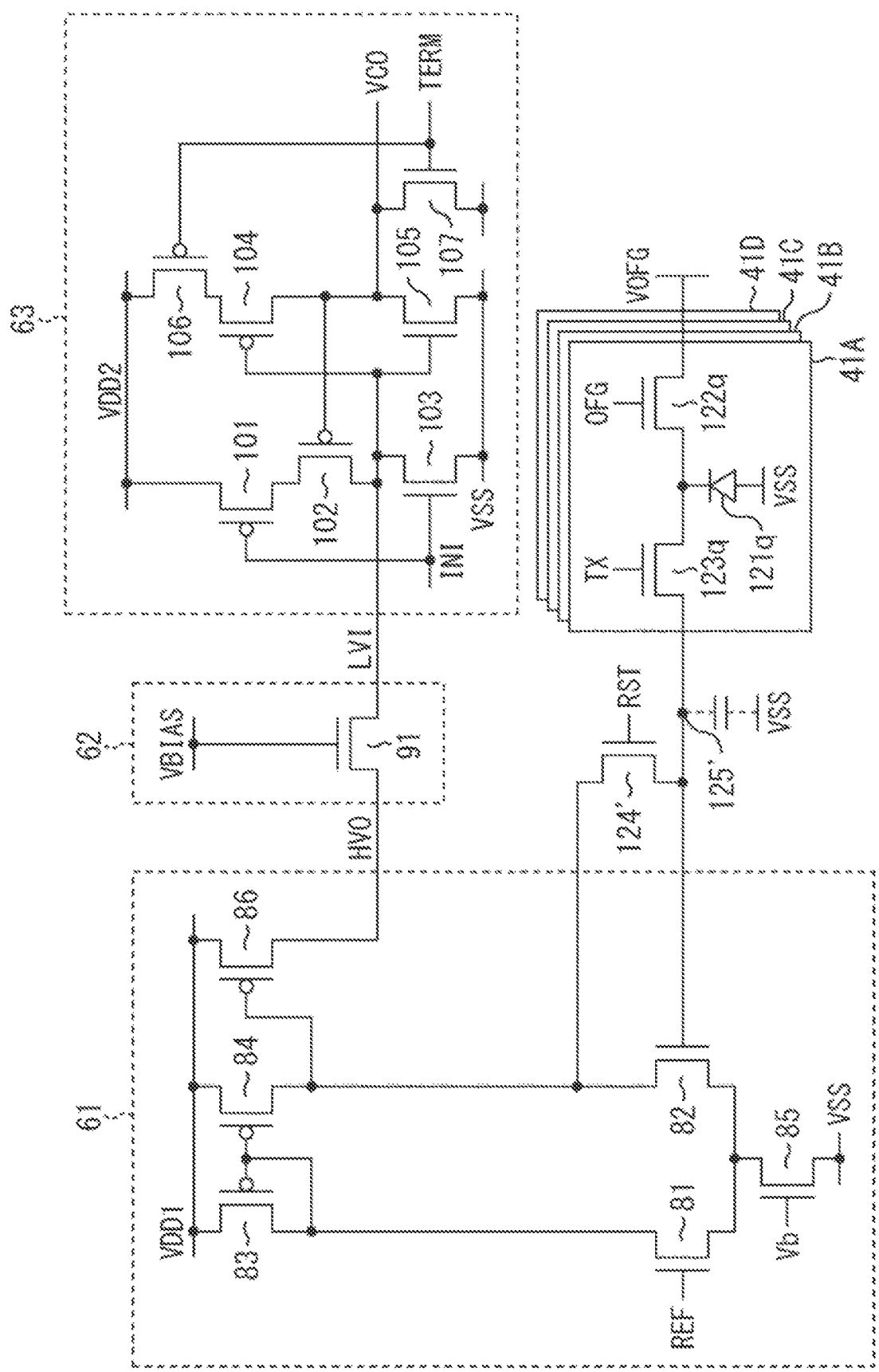
FIG. 17 is a circuit diagram illustrating an exemplary configuration of the comparison circuit in a case of pixel sharing.

FIG. 17 is a circuit diagram illustrating an exemplary configuration of the comparison circuit 51 in a case of pixel sharing in which one ADC 42 is shared by a plurality of pixels 21. FIG. 17 illustrates an exemplary configuration of the comparison circuit 51 in a case where one ADC 42 is shared by four pixels 21 of a pixel 21A, a pixel 21B, a pixel 21C, and a pixel 21D.

In FIG. 17, the configuration of the differential input circuit 61, the voltage conversion circuit 62, and the positive feedback circuit 63 included in the comparison circuit 51 is similar to the configuration illustrated in FIG. 2.

In FIG. 17, the four pixels 21A to 21D are provided with pixel circuits 41A to 41D, and the pixel circuits 41A to 41D are each provided with a photodiode 121*q*, a discharge transistor 122*q*, and a forwarding transistor 123*q*. The reset transistor 124' and the FD 125' are shared by the four pixels 21A to 21D.

Note that, in FIG. 17, the circuit configuration illustrated in FIG. 2 is employed as the circuit configuration of the comparison circuit 51, but any other circuit configuration may be employed.

In this manner, a configuration as illustrated in FIG. 12, 13, or 15 may be applied to the sharing pixel in which one ADC 42 is shared by a plurality of pixels 21, thereby controlling current in the ADC 42 (noise of the ADC 42).

The configuration of the differential input circuit 61 in a case of the four-pixel sharing pixel configuration illustrated in FIG. 17 is same as, for example, the configuration of the differential input circuit 61 in a case of the non-pixel sharing pixel configuration illustrated in FIG. 12. Thus, for example, similarly to the case illustrated in FIG. 12, the bias circuit 501 may be provided in the four-pixel sharing pixel configuration illustrated in FIG. 17 and connected with the gate of the transistor 85 in the differential input circuit 61.

With this configuration, like the case described with reference to FIG. 12, current flowing to the transistor 85 can be controlled on the basis of the determination by the determination unit 401 (for example, determination of whether illuminance is high or low), thereby controlling noise generated at the differential input circuit 61 (the comparison circuit 51 including the differential input circuit 61).

Furthermore, similarly to the case illustrated in FIG. 13, in the four-pixel sharing pixel configuration illustrated in FIG. 17, the DAC 25 may be provided and connected with the gate of the transistor 81 in the differential input circuit 61.

With this configuration, like the case described with reference to FIG. 13, the reference signal REF supplied to the transistor 81 can be controlled on the basis of the determination by the determination unit 401 (for example, determination of whether illuminance is high or low), thereby controlling noise generated at the differential input circuit 61 (the comparison circuit 51 including the differential input circuit 61).

Furthermore, similarity to the case illustrated in FIG. 15, in the four-pixel sharing pixel configuration illustrated in FIG. 17, the bias circuit 501 and the DAC 25 may be provided, the bias circuit 501 may be connected with the gate of the transistor 85 in the differential input circuit 61, and the DAC 25 may be connected with the gate of the transistor 81 in the differential input circuit 61.

With this configuration, like the case described with reference to FIG. 15, current flowing to the transistor 85 can be controlled on the basis of the determination by the determination unit 401 (for example, determination of whether illuminance is high or low), and the reference signal REF supplied to the transistor 81 can be controlled, thereby controlling noise generated at the differential input circuit 61 (the comparison circuit 51 including the differential input circuit 61).

<Application Timing of Control in Sharing Pixel>

Figure 18:
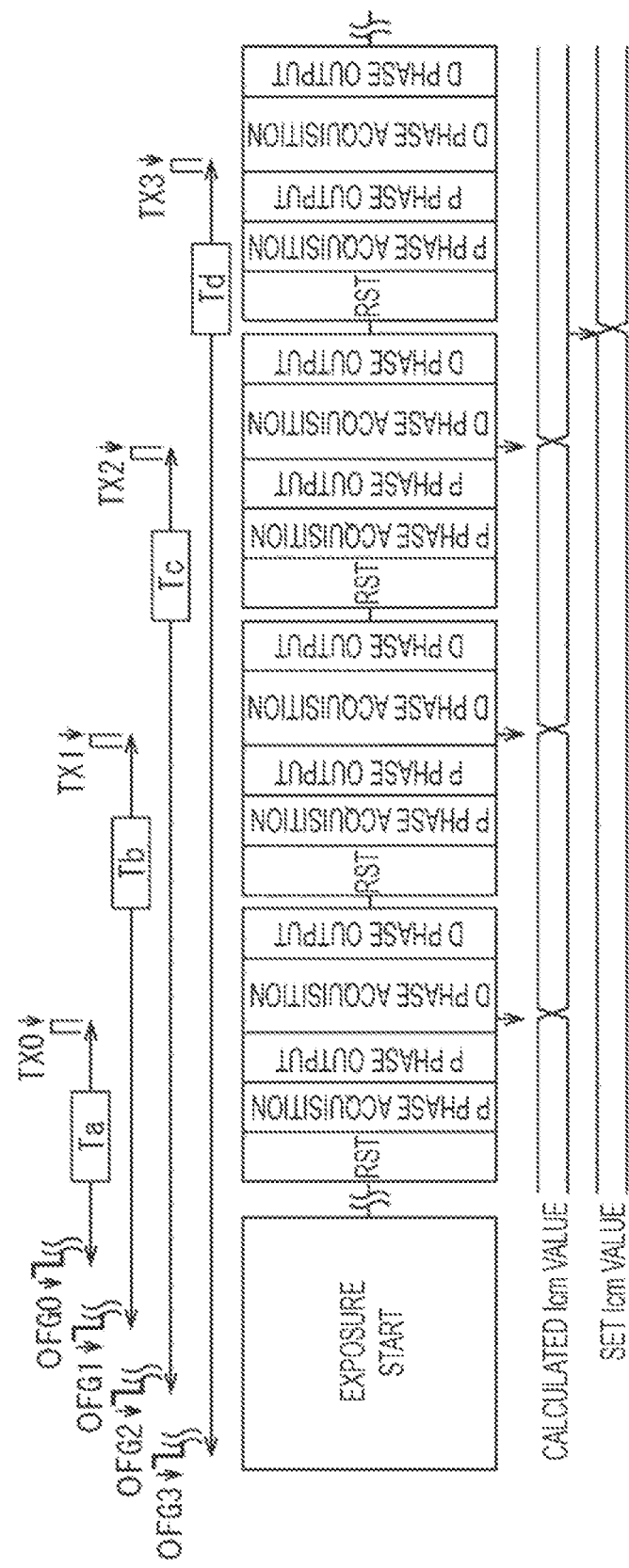
FIG. 18 is a diagram for description of control timing.

The following describes a timing at which a result of the determination by the determination unit 401 in a sharing pixel is output and a timing at which the result of the determination is applied with reference to FIG. 18.

In sharing pixels, processing performed by each pixel circuit 41 is similar to that in the case described with reference to FIG. 16. Specifically, each pixel circuit 41 executes corresponding processing in each of the reset duration, the P phase acquisition duration, the P phase output duration, the D phase acquisition duration, and the D phase output duration, which are provided after the start of exposure.

The following describes an example in which exposure is started when the discharge transistor 122 (OFG) is turned on. At each pixel circuit 41, the exposure duration extends from falling of the discharge transistor 122 provided to the pixel circuit 41 to falling of the forwarding transistor 123.

When four pixels are individually controlled, four global shutter images shifted from each other by one pixel in terms of space resolution can be acquired. High dynamic range (HDR) image capturing is possible by individually controlling the exposure times of these four images (not setting the same exposure time).

For example, when Ta represents the exposure time of a pixel circuit 41A, Tb represents the exposure time of a pixel circuit 41B, Tc represents the exposure time of a pixel circuit 41C, Td represents the exposure time of a pixel circuit 41D, and the relation of Ta:Tb:Tc:Td=1:4:16:64 holds, the dynamic range can be increased to be 64 times larger in the exposure time ratio.

Halation can be prevented from occurring to an image that is saturated through 64-times longer exposure when the saturation does not occur through one-time long exposure.

In such drive, in a case where saturation is not achieved in the shortest exposure time Ta, an image is dark as a whole, for example, with the value of 64 LSB or lower for one bit, and the image is acquired in the exposure time Td, the output after CDS is highly likely to be equal to or smaller than 4096. In such a case, like the case described with reference to FIG. 16, for example, after continuation for eight frames, noise generation is reduced at reading in the longest exposure time Td by controlling the current Icm in the differential input circuit 61 and the current of a reference signal Ref supplied to the differential input circuit 61 (generated at the DAC 25).

Furthermore, in a case of the exposure time Ta only, when a set accuracy cannot be obtained due to influence of shot noise or the like, control may be performed to use signals in the exposure times Tb and Tc in combination to determine whether, for example, an average value in the exposure time Tb exceeds 256 and an average value in the exposure time Tc exceeds 1024 and apply settings in the exposure time Td after a certain number of frames.

Furthermore, calculation may be performed in the exposure time Td in a predetermined frame, and calculated setting may be applied in the exposure times Ta, Tb, Tc, and Td in the next frame of the predetermined frame. According to such control, electric power consumption can be optimized by performing the application only in the long time exposure Td, in which a dark image mostly desired to avoid influence of noise is output, while performing HDR image capturing.

Note that, although the above describes the example in which outputting is performed four times in the order of the P phase and the D phase, the above-described present technology is basically similarly applicable to the opposite order of the D phase and the P phase, complex reading of the P phase and the D phase, and two- or 16-times reading instead of four-times reading.

Note that, although the above describes the example of the four-pixel sharing, the present technology is also applicable to, for example, two-pixel sharing other than the four-pixel sharing.

<Multiple Substrate Configuration>

In the above description, the image capturing apparatus 1 is formed on one semiconductor substrate 11, but may have a configuration in which circuits are separately formed on a plurality of semiconductor substrates 11.

Figure 19:
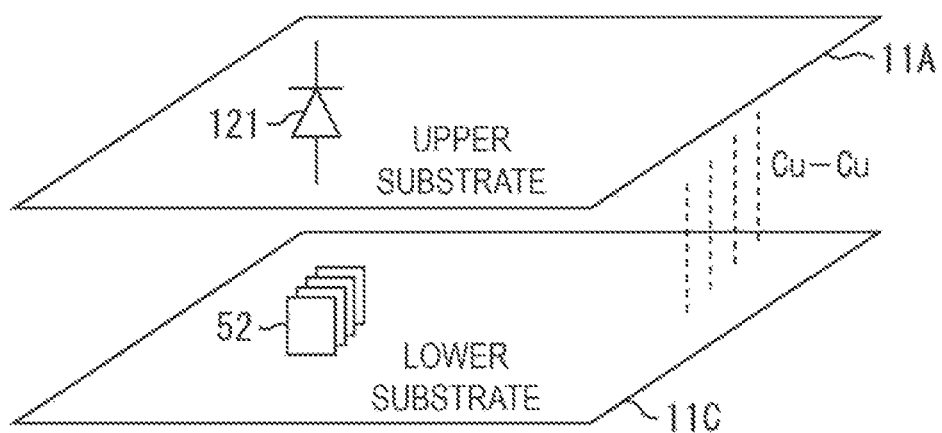
FIG. 19 is a conceptual diagram of formation of the image capturing apparatus by stacking two semiconductor substrates.

FIG. 19 illustrates a conceptual diagram of formation of the image capturing apparatus 1 by stacking two semiconductor substrates 11 of an upper substrate 11A and a lower substrate 11C.

At least the pixel circuit 41 including the photodiode 121 is formed on the upper substrate 11A. At least the data storage unit 52 configured to store a time code and the time code forwarding unit 23 are formed on the lower substrate 11C. The upper substrate 11A and the lower substrate 11C are joined to each other by, for example, Cu—Cu metallic bonding or the like.

Figure 20:
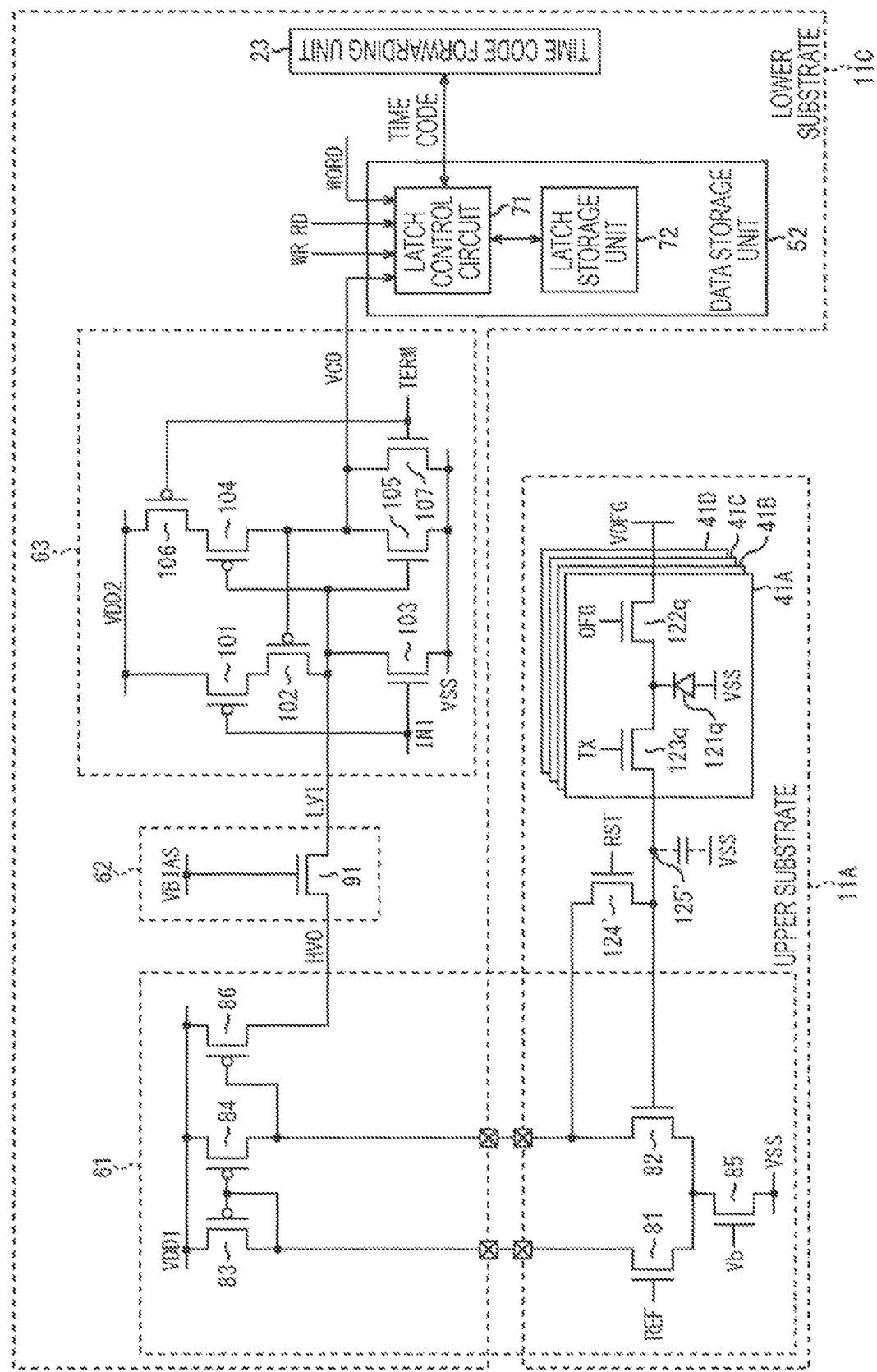
FIG. 20 is a diagram illustrating an exemplary circuit configuration in a case where the image capturing apparatus includes the two semiconductor substrates.

FIG. 20 illustrates an exemplary circuit configuration formed on each of the upper substrate 11A and the lower substrate 11C. The pixel circuit 41 and circuits of the transistors 81, 82, and 85 of the differential input circuit 61 in the ADC 42 are formed on the upper substrate 11A. Circuits of the ADC 42 except for the transistors 81, 82, and 85 and the time code forwarding unit 23 are formed on the lower substrate 11C.

The upper substrate 11A may be a pixel wafer including NMOS only, and the lower substrate 11C may be a logic wafer on which a circuit before a PMOS included in the differential input circuit 61 is formed. With this configuration, as compared to PMOS slow response of the differential input circuit 61, steep response can be performed through PMOS feedback (positive feedback) to a constant voltage side when the threshold of NOR at a later stage is exceeded.

Thus, the time of through current is minimized, and simultaneously, a digital signal (gray code) supplied from the outside can be accurately latched and stored. The latched data is output to an external processing unit and used in processing such as CDS.

<Multiple Substrate Configuration 2>

In the example illustrated in FIGS. 19 and 20, the image capturing apparatus 1 includes two semiconductor substrates 11, but may include three semiconductor substrates 11.

Figure 21:
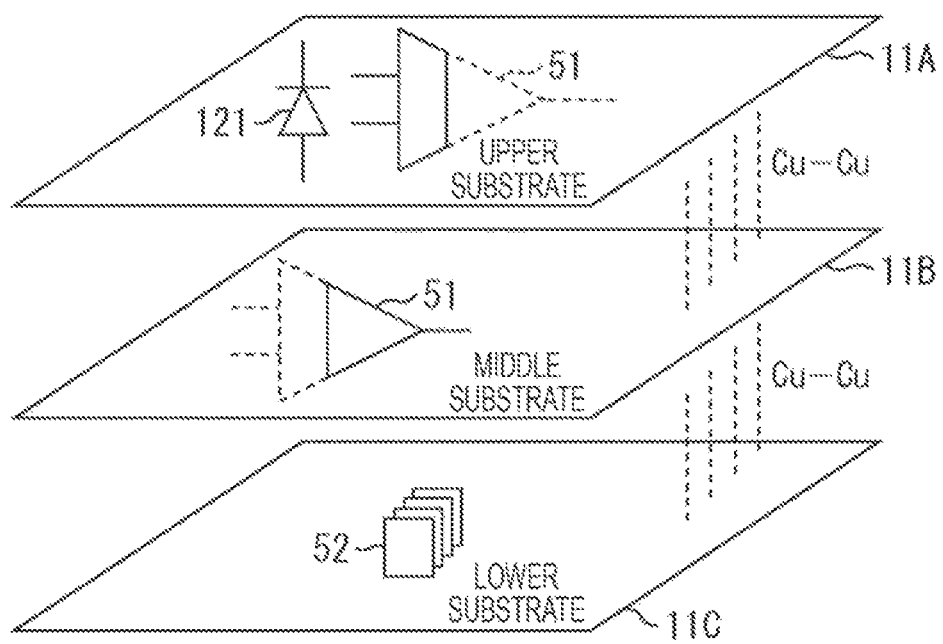
FIG. 21 is a conceptual diagram of formation of the image capturing apparatus by stacking three semiconductor substrates.

FIG. 21 illustrates a conceptual diagram of formation of the image capturing apparatus 1 by stacking three semiconductor substrates 11 of an upper substrate 11A, a middle substrate 11B, and a lower substrate 11C.

The pixel circuit 41 including the photodiode 121 and at least part of circuits of the comparison circuit 51 are formed on the upper substrate 11A. At least the data storage unit 52 configured to store a time code and the time code forwarding unit 23 are formed on the lower substrate 11C. The remaining circuits of the comparison circuit 51, which are not disposed on the upper substrate 11A are formed on the middle substrate 11B. The upper substrate 11A and the middle substrate 11B, or the middle substrate 11B and the lower substrate 11C are joined to each other by, for example, Cu—Cu metallic bonding or the like.

Figure 22:
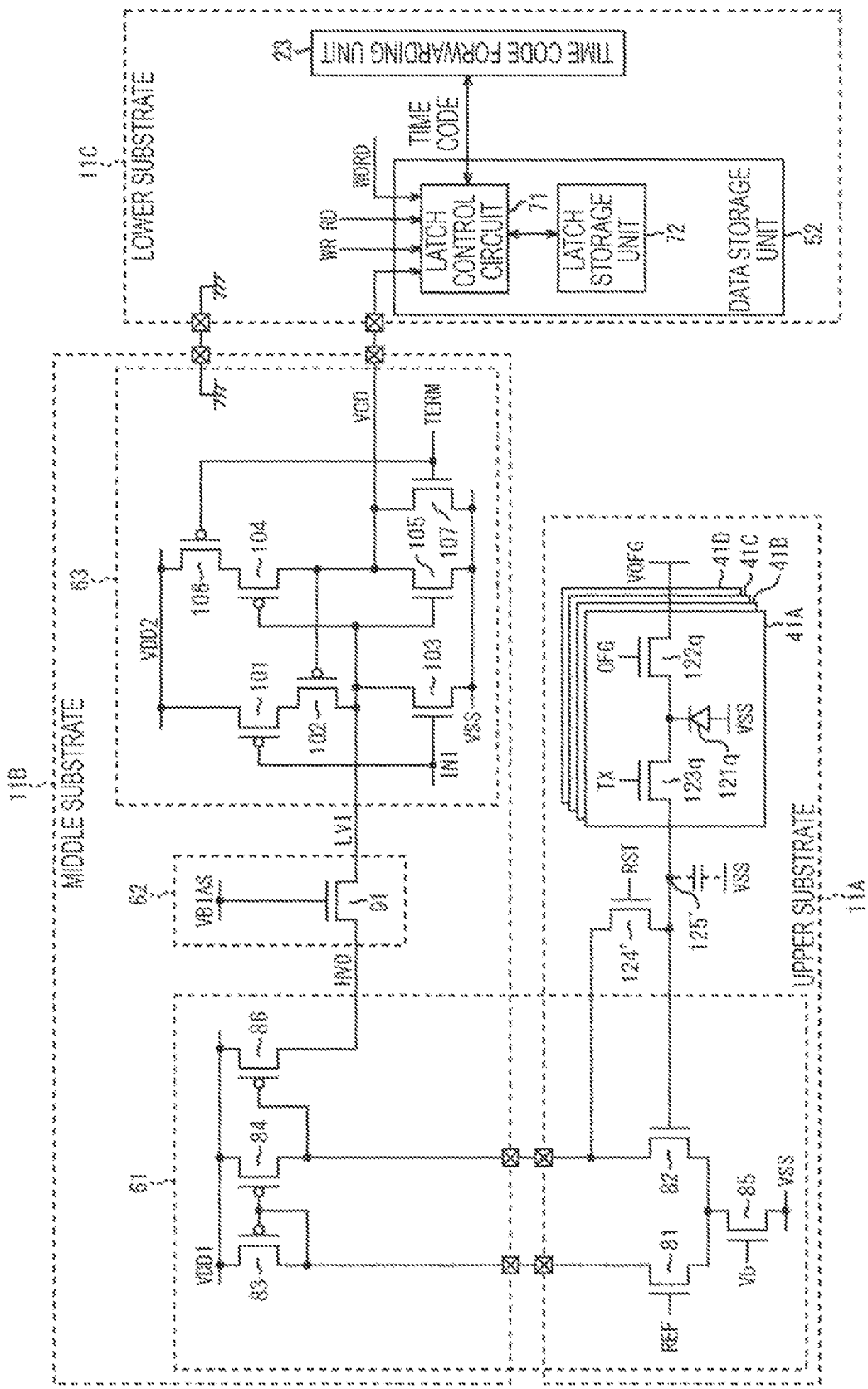
FIG. 22 is a diagram illustrating an exemplary circuit configuration in a case where the image capturing apparatus includes the three semiconductor substrates.

FIG. 22 illustrates an exemplary circuit arrangement of each semiconductor substrate 11 in a case where the image capturing apparatus 1 includes the three semiconductor substrates 11.

In the example illustrated in FIG. 22, the circuits disposed on the upper substrate 11A are same as the circuits on the upper substrate 11A illustrated in FIG. 20, the remaining circuits of the comparison circuit 51 are disposed on the middle substrate 11B, and the data storage unit 52 and the time code forwarding unit 23 are disposed on the lower substrate 11C.

In the examples illustrated in FIGS. 19 to 22, the determination unit 401, the bias circuit 501, the DAC 25, and the like may be formed on the lower substrate 11C. Furthermore, a substrate stacked on the lower substrate 11C may be further provided, and the determination unit 401, the bias circuit 501, the DAC 25, and the like may be formed on this substrate.

Furthermore, the image capturing apparatus 1 may have a stacking structure, and the ADC 42 may be connected with each pixel. For example, a first layer may include a photoelectric conversion element (the photodiode 121), and a conversion unit (the ADC 42) may be connected with each photoelectric conversion element and formed on a second layer below the first layer.

Furthermore, a plurality of image sensors (image capturing apparatuses 1) of two or more layers may be provided, and the plurality of image sensors as image capturing apparatuses 1 may detect different kinds of light such as radiation, infrared light, and ambient light, for example.

<Other Configurations>

The application range of the present technology is not limited to, for example, the configuration described above with reference to FIG. 10, but the present technology is applicable to configurations as described below.

Figure 23:
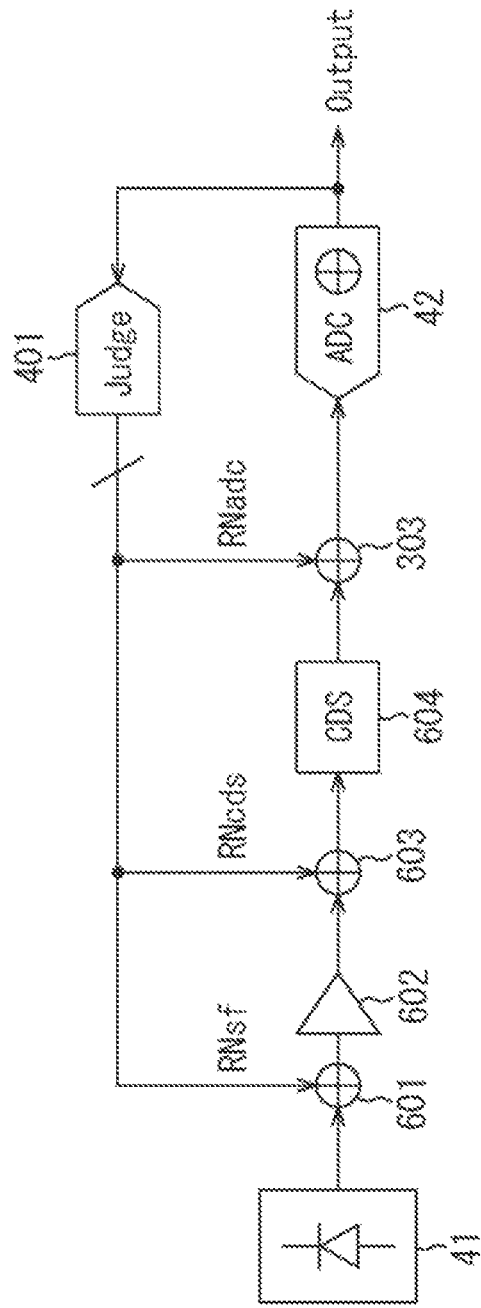
FIG. 23 is a diagram for description of another configuration of the circuit including the determination unit.

FIG. 23 is a diagram illustrating another configuration of the ADC 42 and a peripheral circuit to which the present technology is applied. The configuration illustrated in FIG. 23 includes a source follower 602 and a CDS 604 between the pixel circuit 41 and the ADC 42 (addition unit 303) in addition to the configuration illustrated in FIG. 10. Furthermore, the configuration includes an addition unit 601 configured to control noise at the source follower 602, and an addition unit 603 configured to control noise at the CDS 604.

The determination unit 401 controls the amount of noise at the source follower 602, the CDS 604, and the ADC 42 in accordance with the output from the ADC 42. The determination unit 401 controls the amount of noise at at least one of the source follower 602, the CDS 604, or the ADC 42.

Although FIG. 23 illustrates a case where a result of the determination by the determination unit 401 is supplied to the addition unit 601, the addition unit 603, and the addition unit 303, the result may be supplied, for example, only to the addition unit 601 of the source follower 602. Alternatively, only the CDS 604 or the ADC 42 may be supplied with the determination result from the determination unit 401.

Furthermore, as illustrated in FIG. 23, the result of the determination by the determination unit 401 may be supplied to the addition unit 601, the addition unit 603, and the addition unit 303 to control the amount of noise at the source follower 602, the CDS 604, and the ADC 42, respectively. In this case, the same determination result may be supplied, or different determination results suitable for the respective units may be supplied.

In the configuration illustrated in FIG. 23, for example, current from a current source of the source follower 602 is controlled to achieve noise reduction and low electrical power consumption. Furthermore, for example, current in an analog element included in the CDS 604 is controlled to achieve noise reduction and low electrical power consumption. Furthermore, current in the ADC 42 is controlled as described above to achieve noise reduction and low electrical power consumption.

Figure 24:
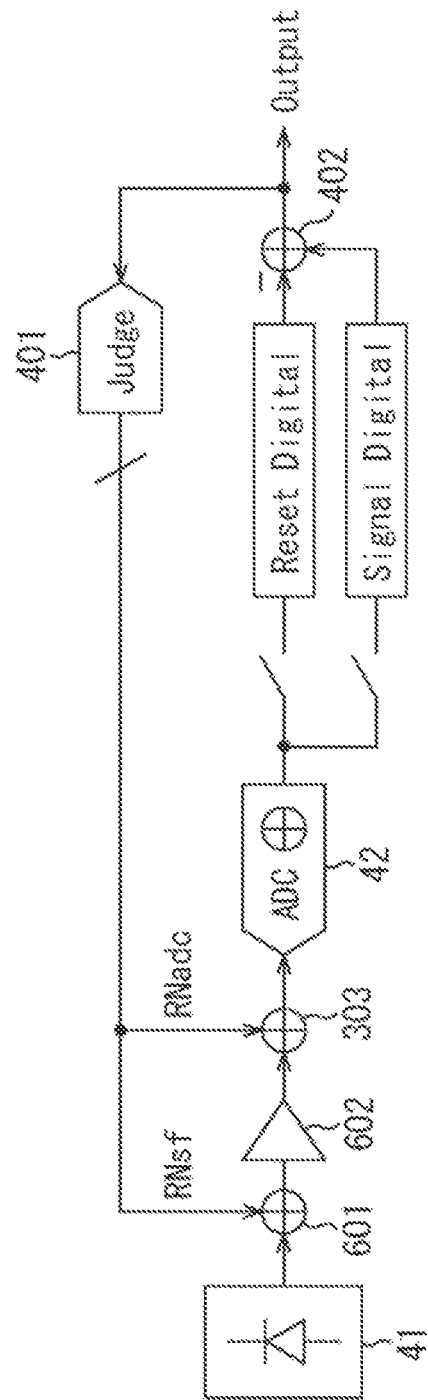
FIG. 24 is a diagram for description of another configuration of the circuit including the determination unit.

FIG. 24 is a diagram illustrating another configuration of the ADC 42 and a peripheral circuit to which the present technology is applied. The configuration illustrated in FIG. 24 includes the source follower 602 between the pixel circuit 41 and the ADC 42 (addition unit 303) in addition to the configuration illustrated in FIG. 10. Furthermore, the configuration also includes the addition unit 601 configured to control noise at the source follower 602.

The configuration illustrated in FIG. 24 is a configuration in which the present technology is applied to a slope-type column ADC. In such a configuration, the amount of noise may be controlled at only one of the source follower 602 and the ADC 42. Alternatively, the amounts of noise at the source follower 602 and the ADC 42 may be each controlled.

In a case where the amounts of noise at the source follower 602 and the ADC 42 are each controlled, the same determination result or different determination results may be supplied from the determination unit 401.

In the configuration illustrated in FIG. 24, for example, current from the current source of the source follower 602 is controlled to achieve noise reduction and low electrical power consumption. Furthermore, current in the ADC 42 is controlled as described above to achieve noise reduction and low electrical power consumption.

Figure 25:
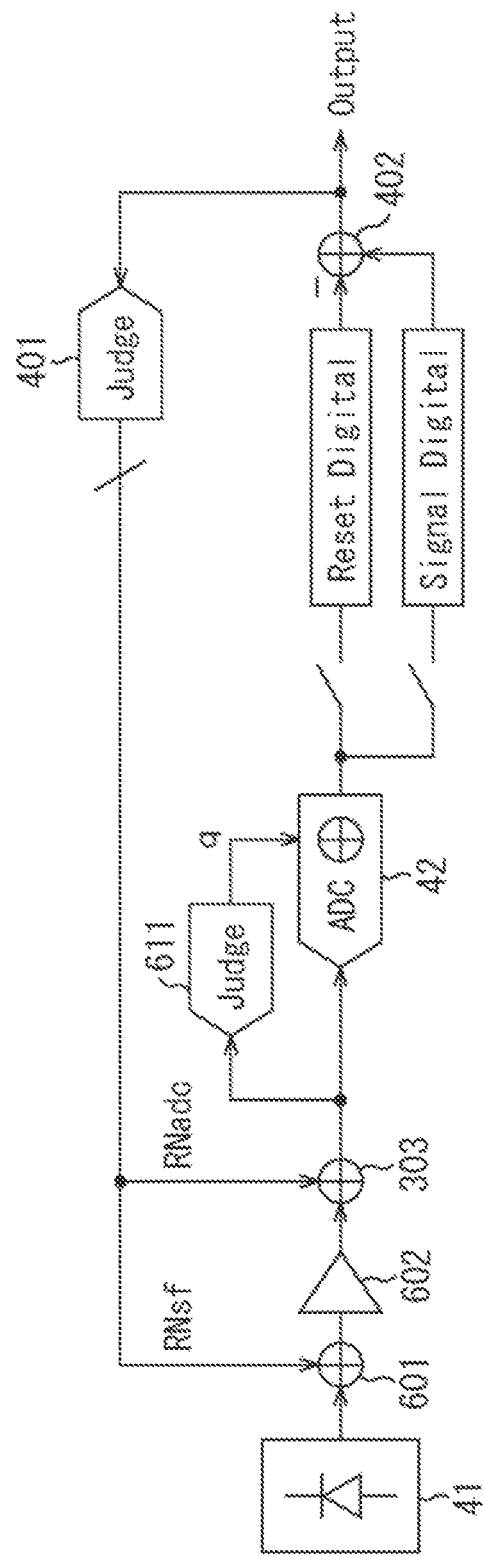
FIG. 25 is a diagram for description of another configuration of the circuit including the determination unit.

FIG. 25 is a diagram illustrating another configuration of the ADC 42 and a peripheral circuit to which the present technology is applied. The configuration illustrated in FIG. 25 includes the source follower 602 between the pixel circuit 41 and the ADC 42 (addition unit 303) in addition to the configuration illustrated in FIG. 10. Furthermore, the configuration also includes the addition unit 601 configured to control noise at the source follower 602. The configuration also includes a determination unit 611 configured to control the ADC 42 in accordance with the output from the source follower 602.

The configuration illustrated in FIG. 25 is a configuration in which the present technology is applied to an adaptive gain multi-slope-type ADC. In such a configuration, the amount of noise may be controlled at only one of the source follower 602 and the ADC 42. Alternatively, the amounts of noise at the source follower 602 and the ADC 42 may be each controlled.

In a case where the amounts of noise at the source follower 602 and the ADC 42 are each controlled, the same determination result or different determination results may be supplied from the determination unit 401.

In the configuration illustrated in FIG. 25, for example, current from the current source of the source follower 602 is controlled to achieve noise reduction and low electrical power consumption. Furthermore, current in the ADC 42 is controlled as described above to achieve noise reduction and low electrical power consumption.

Figure 26:
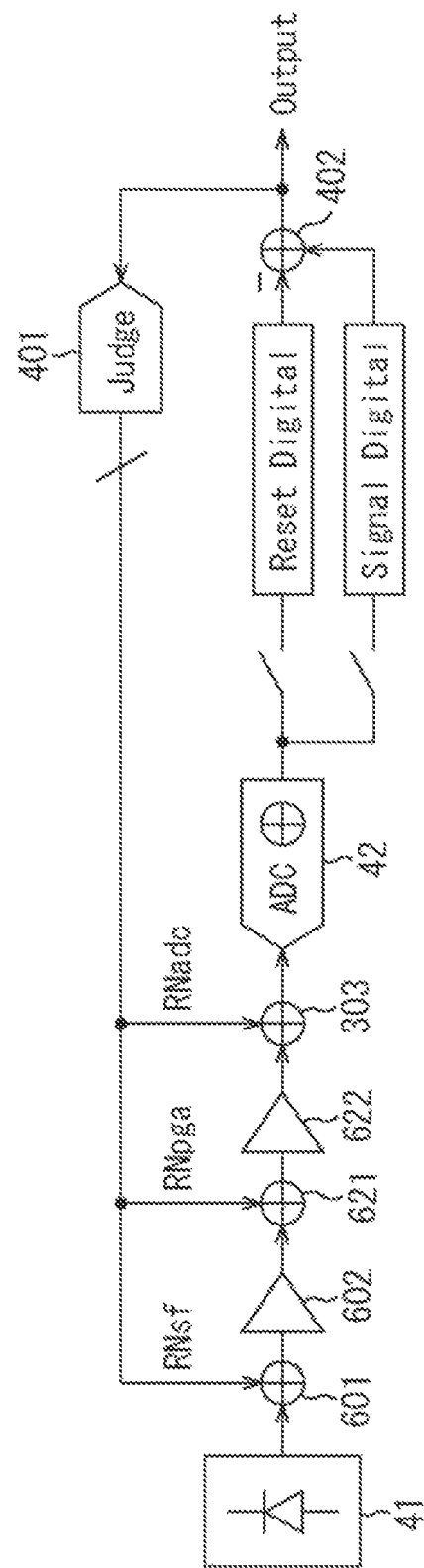
FIG. 26 is a diagram for description of another configuration of the circuit including the determination unit.

FIG. 26 is a diagram illustrating another configuration of the ADC 42 and a peripheral circuit to which the present technology is applied. The configuration illustrated in FIG. 26 includes a source follower 602 and a gain amplifier 622 between the pixel circuit 41 and the ADC 42 (addition unit 303) in addition to the configuration illustrated in FIG. 10. Furthermore, the configuration includes the addition unit 601 configured to control noise at the source follower 602, and an addition unit 621 configured to control noise at the gain amplifier 622.

The determination unit 401 controls the amount of noise at each of the source follower 602, the gain amplifier 622, and the ADC 42 in accordance with the output from the ADC 42. The determination unit 401 controls the amount of noise at at least one of the source follower 602, the gain amplifier 622, or the ADC 42.

The determination unit 401 may supply the same determination result or different determination results to the source follower 602, the gain amplifier 622, and the ADC 42.

In the configuration illustrated in FIG. 26, for example, current from the current source of the source follower 602 is controlled to achieve noise reduction and low electrical power consumption. Furthermore, for example, current in an analog element included in the gain amplifier 622 is controlled to achieve noise reduction and low electrical power consumption. Furthermore, current in the ADC 42 is controlled as described above to achieve noise reduction and low electrical power consumption.

The present technology is applicable to any of these configurations, and through the application, current consumed at an analog circuit such as a source follower, a gain amplifier, a CDS, or an ADC can be adaptively adjusted in a variable manner on the basis of an AD converted output signal, thereby achieving low electrical power at high illuminance and low noise at low illuminance.

Furthermore, each stacking structure described with reference to FIGS. 19 to 22 is applicable to any of these configurations.

<Exemplary Applications to Electronic Device>

The present disclosure is not limited to application to an image capturing apparatus. Specifically, the present disclosure is applicable to any electronic device including the image capturing apparatus as an image acquisition unit (photoelectrical conversion unit), such as an image capturing apparatus such as a digital still camera or a video camera, a portable terminal device having an image capturing function, or a copier including an image capturing apparatus as an image reading unit. Such an image capturing apparatus may be formed as one chip or a module collectively packaging an image capturing unit, and a signal processing unit or an optical system and having an image capturing function.

Figure 27:
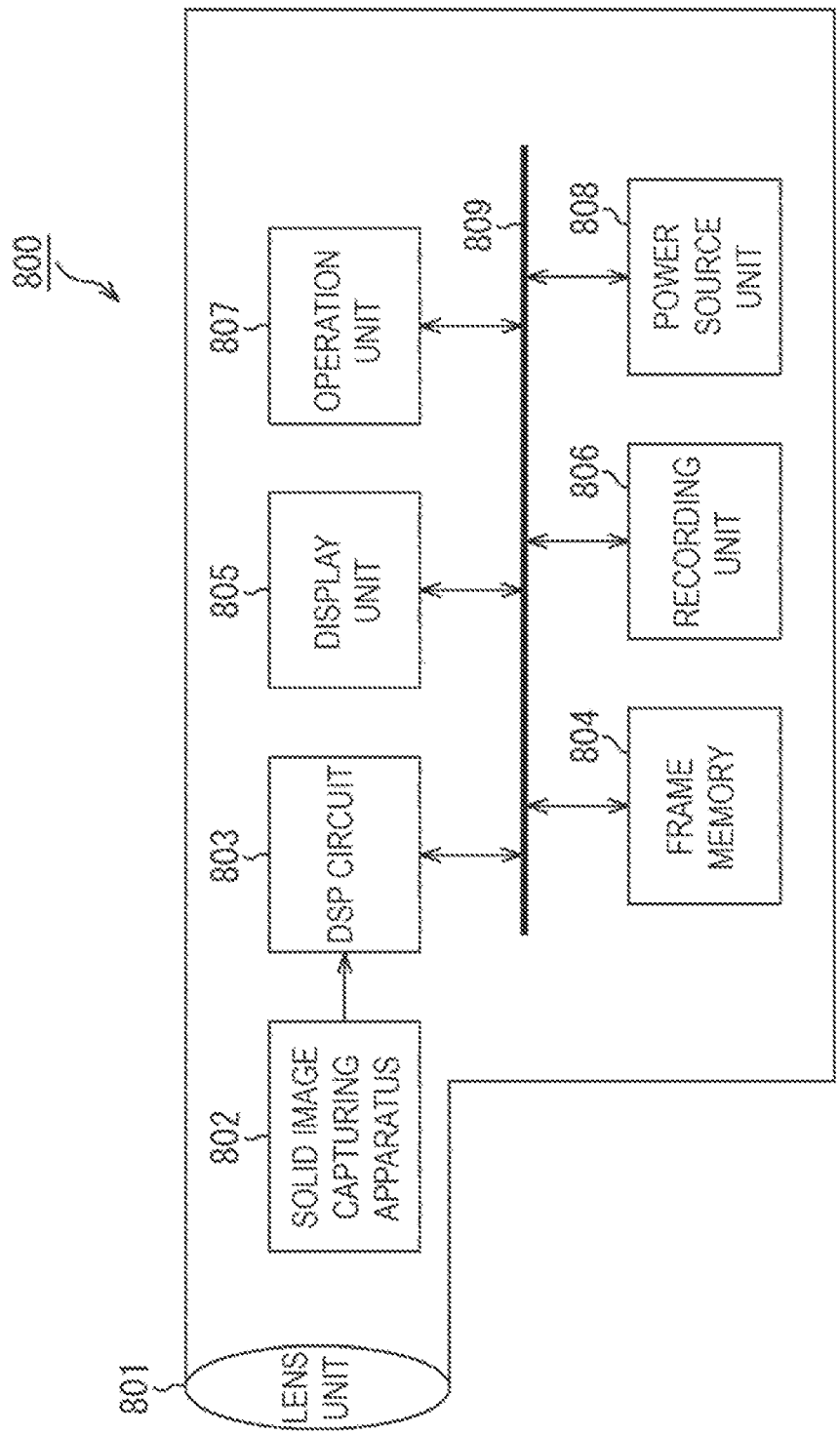
FIG. 27 is a block diagram illustrating an exemplary configuration of the image capturing apparatus as an electronic device according to the present disclosure.

FIG. 27 is a block diagram illustrating an exemplary configuration of an image capturing apparatus as an electronic device according to the present disclosure.

This image capturing apparatus 800 illustrated in FIG. 27 includes an optical unit 801 including a lens unit and the like, an image capturing apparatus (image capturing device) 802 employing the above-described configuration of the image capturing apparatus 1, and a digital signal processor (DSP) circuit 803 as a camera signal processor. Furthermore, the image capturing apparatus 800 includes a frame memory 804, a display unit 805, a recording unit 806, an operation unit 807, and a power source unit 808. The DSP circuit 803, the frame memory 804, the display unit 805, the recording unit 806, the operation unit 807, and the power source unit 808 are connected with each other through a bus line 809.

The optical unit 801 acquires incident light (image light) from an object and forms an image on an imaging plane of the image capturing apparatus 802. The image capturing apparatus 802 converts the amount of the incident light imaged on the imaging plane by the optical unit 801 into an electric signal for each pixel, and outputs the electric signal as a pixel signal.

The display unit 805 is, for example, a panel display device such as a liquid crystal panel or an organic electro luminescence (EL) panel, and displays a moving image or a still image captured by the image capturing apparatus 802. The recording unit 806 records, in a recording medium such as a hard disk or a semiconductor memory, the moving image or the still image captured by the image capturing apparatus 802.

The operation unit 807 issues operation commands on various functions of the image capturing apparatus 800 in accordance with an operation by a user. The power source unit 808 supplies various power sources as operation power sources of the DSP circuit 803, the frame memory 804, the display unit 805, the recording unit 806, and the operation unit 807 to these supply targets as appropriate.

The image capturing apparatus 1 employing the above-described configuration may be used as the image capturing apparatus 802.

The present disclosure is not limited to an image capturing apparatus, but is applicable to a general semiconductor device including any other semiconductor integrated circuit.

Embodiments of the present disclosure are not limited to the above-described embodiments, and various modifications are possible without departing from the gist of the present disclosure.

A circuit configuration according to each above-described embodiment is described as a circuit configuration in which electric charge is electrons, but the present disclosure is also applicable to a circuit configuration in which electric charge is holes. Furthermore, each above-described circuit configuration is also applicable to a circuit configuration in which the polarity of each transistor (NMOS transistor or PMOS transistor) is interchanged. In this case, Hi and Low of a control signal input to the transistor are inverted.

In each above-described embodiment, the reference signal REF is a slope signal having a level (voltage) that monotonically decreases as time elapses, but may be a slope signal having a level (voltage) that monotonically increases as time elapses.

In addition, it is possible to adopt a form in which all or a part of the above-described plural embodiments are combined. A mode in which other embodiments which are not described in the above-described embodiment are combined appropriately is also possible.

<Exemplary Application to Internal Information Acquisition System>

Figure 28:
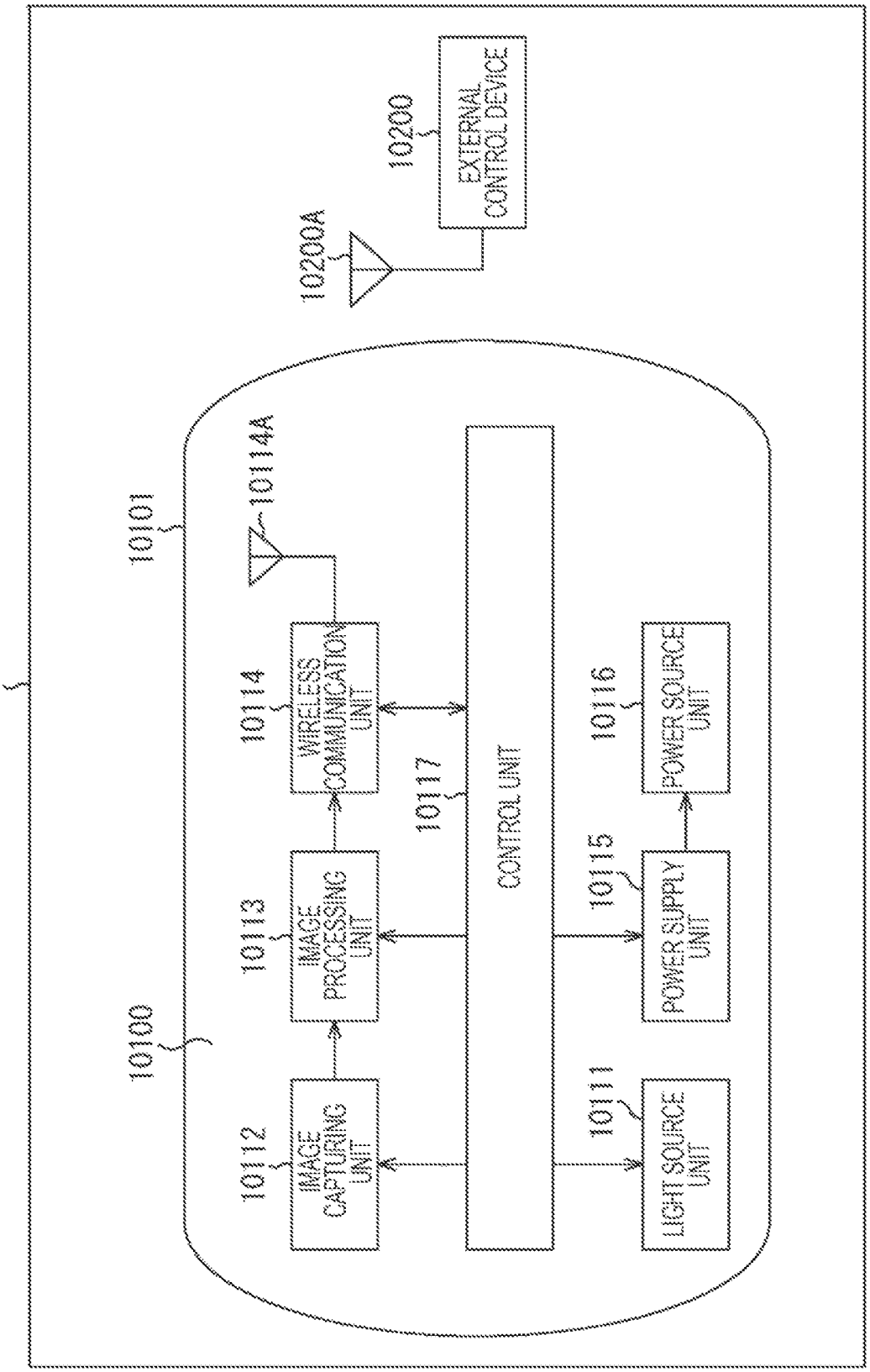
FIG. 28 is a block diagram illustrating an exemplary schematic configuration of an internal information acquisition system.

FIG. 28 is a block diagram illustrating an exemplary schematic configuration of a system to which the technology (present technology) according to the present disclosure is applicable and that is configured to acquire internal information of a patient by using a capsule endoscope.

A internal information acquisition system 10001 includes a capsule endoscope 10100 and an external control device 10200.

The capsule endoscope 10100 is taken in by the patient at examination. The capsule endoscope 10100 has an image capturing function and a wireless communication function, moves inside an organ such as the stomach or the intestine by peristaltic motion or the like until naturally discharged from the patient, while sequentially capturing images (hereinafter also referred to as internal images) of the inside of the organ at a predetermined interval and sequentially transmitting information of the internal images to the external control device 10200 outside the body in a wireless manner.

The external control device 10200 controls overall operation of the internal information acquisition system 10001. Furthermore, the external control device 10200 receives the information of the internal images transmitted from the capsule endoscope 10100, and generates, on the basis of the received internal image information, image data for displaying the internal images on a display device (not illustrated).

In this manner, the internal information acquisition system 10001 can obtain, as needed, an internal image obtained by capturing the situation of the inside of the body of the patient until the capsule endoscope 10100 is discharged after being taken in.

The following describes the configurations and functions of the capsule endoscope 10100 and the external control device 10200 in more detail.

The capsule endoscope 10100 includes a capsule-shaped housing 10101, and the housing 10101 houses a light source unit 10111, an image capturing unit 10112, an image processing unit 10113, a wireless communication unit 10114, a power supply unit 10115, a power source unit 10116, and a control unit 10117.

The light source unit 10111 is achieved by a light source such as a light emitting diode (LED), for example, and irradiates an imaging visual field of the image capturing unit 10112 with light.

The image capturing unit 10112 includes an image sensor, and an optical system including a plurality of lenses provided before the image sensor. Reflected light (hereinafter referred to as observation light) of light with which a body tissue as an observation target is irradiated is condensed through the optical system and incident on the image sensor. In the image capturing unit 10112, the image sensor photoelectrically converts the observation light incident thereon, and generates an image signal corresponding to the observation light. The image signal generated by the image capturing unit 10112 is provided to the image processing unit 10113.

The image processing unit 10113 is achieved by a processor such as a central processing unit (CPU) or a graphics processing unit (GPU), and performs various kinds of signal processing on the image signal generated by the image capturing unit 10112. The image processing unit 10113 provides the image signal provided with the signal processing to the wireless communication unit 10114 as RAW data.

The wireless communication unit 10114 performs predetermined processing such as modulation processing on the image signal provided with the signal processing by the image processing unit 10113, and transmits the image signal to the external control device 10200 through an antenna 10114A. Furthermore, the wireless communication unit 10114 receives a control signal related to drive control of the capsule endoscope 10100 from the external control device 10200 through the antenna 10114A. The wireless communication unit 10114 provides the control signal received from the external control device 10200 to the control unit 10117.

The power supply unit 10115 includes, for example, an incoming antenna coil, an electrical power regeneration circuit configured to recover electrical power from current generated at the antenna coil, and a booster circuit. The power supply unit 10115 generates electrical power by what is called the principle of non-contact charging.

The power source unit 10116 is achieved by a secondary battery, and electrically stores the electrical power generated by the power supply unit 10115. In FIG. 28, for simplification of the drawing, for example, an arrow indicating the supply destination of electrical power from the power source unit 10116 is not illustrated, but the electrical power stored in the power source unit 10116 can be supplied to the light source unit 10111, the image capturing unit 10112, the image processing unit 10113, the wireless communication unit 10114, and the control unit 10117, and used to drive these units.

The control unit 10117 is achieved by a processor such as a CPU, and controls drive of the light source unit 10111, the image capturing unit 10112, the image processing unit 10113, the wireless communication unit 10114, and the power supply unit 10115 as appropriate in accordance with the control signal transmitted from the external control device 10200.

The external control device 10200 is achieved by, for example, a processor such as a CPU or a GPU, or a micro computer or a control substrate on which a processor and a storage element such as a memory are consolidated. The external control device 10200 controls operation of the capsule endoscope 10100 by transmitting a control signal to the control unit 10117 of the capsule endoscope 10100 through an antenna 10200A. In the capsule endoscope 10100, for example, a condition of light irradiation of the observation target at the light source unit 10111 can be changed by a control signal from the external control device 10200. Furthermore, an image capturing condition (for example, the frame rate, exposure value of the image capturing unit 10112, or the like) can be changed by a control signal from the external control device 10200. Furthermore, the content of processing at the image processing unit 10113 or a condition (for example, the transmission interval, the number of transmitted images, or the like) of transmission of an image signal by the wireless communication unit 10114 may be changed by a control signal from the external control device 10200.

Furthermore, the external control device 10200 provides various kinds of image processing to an image signal transmitted from the capsule endoscope 10100, and generates image data for displaying a captured internal image on the display device. This image processing includes various kinds of signal processing such as development processing (demosaic processing), high image quality processing (for example, band emphasis processing, super-resolution processing, noise reduction (NR) processing, and/or image blur correction processing), and/or enlargement processing (electronic zoom processing). The external control device 10200 controls drive of the display device to display a internal image captured on the basis of the generated image data. Alternatively, the external control device 10200 may record the generated image data in a record device (not illustrated) or output the generated image data to a printing device (not illustrated) for printing.

The above describes an exemplary internal information acquisition system to which the technology according to the present disclosure is applicable. The technology according to the present disclosure is applicable to, for example, any of the light source unit 10111 to the control unit 10117 in the above-described configuration. Specifically, the image capturing apparatus 1 including the ADC 42 illustrated in, for example, FIG. 3 is applicable to the image capturing unit 10112.

<Exemplary Application to Endoscope Operation System>

Figure 29:
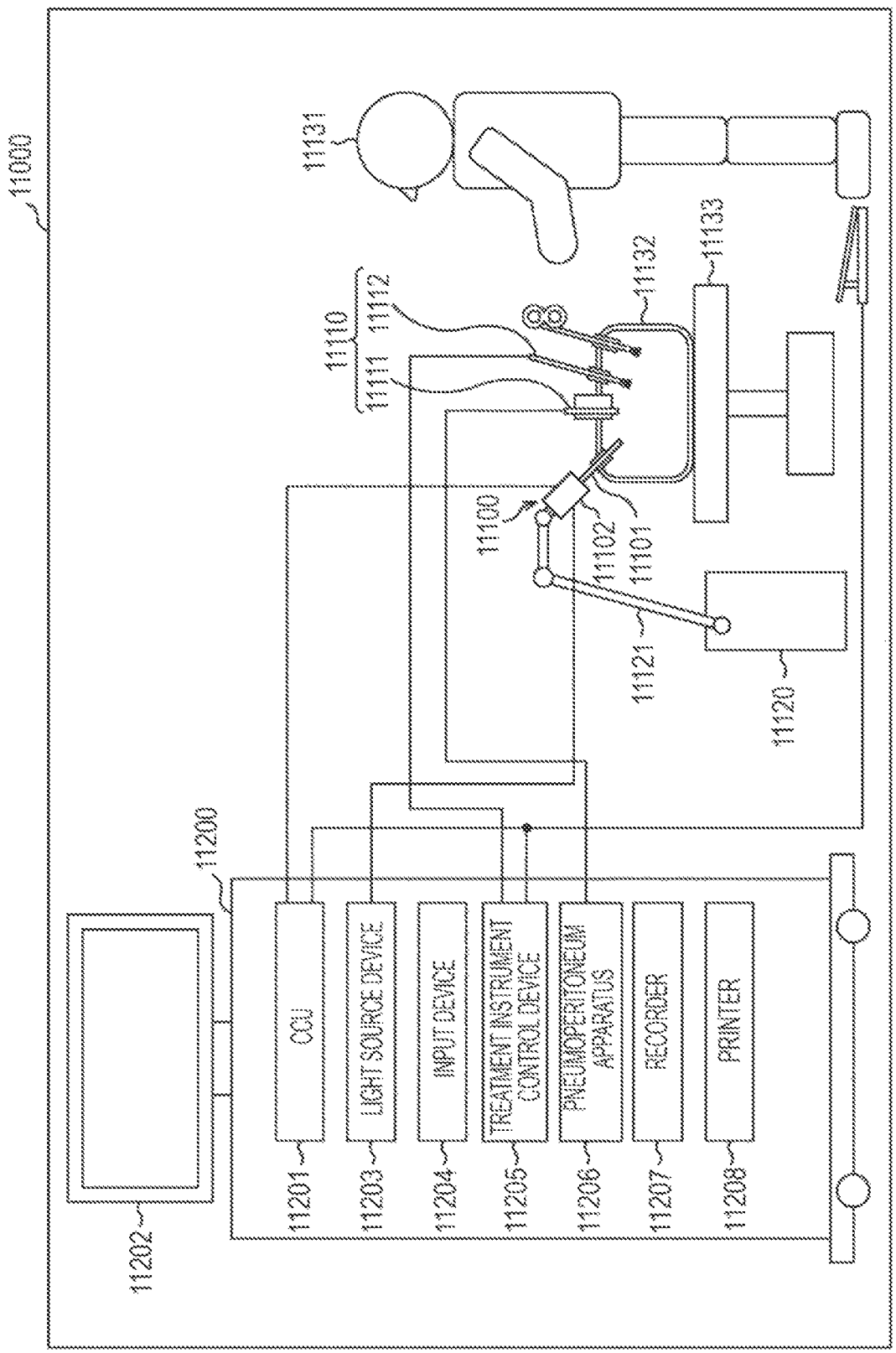
FIG. 29 is a diagram illustrating an exemplary schematic configuration of an endoscope operation system.

FIG. 29 is a diagram illustrating an exemplary schematic configuration of an endoscope operation system to which the technology (present technology) according to the present disclosure is applicable.

FIG. 29 illustrates a situation in which an operator (doctor) 11131 is performing an operation on a patient 11132 on a patient bed 11133 by using an endoscope operation system 11000. As illustrated in FIG. 29, the endoscope operation system 11000 includes an endoscope 11100, other operation instruments 11110 such as a pneumoperitoneum tube 11111 and an energy treatment instrument 11112, a support arm device 11120 supporting the endoscope 11100, and a cart 11200 on which various devices for an endoscopic operation are mounted.

The endoscope 11100 includes a lens barrel 11101, a region of which extending from a leading end by a predetermined length is inserted into the body cavity of the patient 11132, and a camera head 11102 connected with a base end of the lens barrel 11101. In the illustrated example, the endoscope 11100 is what is called a rigid scope including the rigid lens barrel 11101, but the endoscope 11100 may be what is called a flexible scope including a flexible lens barrel.

The leading end of the lens barrel 11101 is provided with an opening to which an objective lens is fitted. The endoscope 11100 is connected with a light source device 11203, and light generated by the light source device 11203 is guided to the leading end of the lens barrel by a light guide extending inside the lens barrel 11101, and emitted toward an observation target in the body cavity of the patient 11132 through the objective lens. Note that the endoscope 11100 may be a direct-view scope, an oblique view scope, or a side view scope.

An optical system and an image sensor are provided inside the camera head 11102, and reflected light (observation light) from the observation target is condensed onto the image sensor through the optical system. The image sensor photoelectrically converts the observation light, and generates an electric signal corresponding to the observation light, in other words, an image signal corresponding to an observation image. This image signal is transmitted to a camera control unit (CCU) 11201 as RAW data.

The CCU 11201 is achieved by, for example, a central processing unit (CPU) or a graphics processing unit (GPU), and controls overall operation of the endoscope 11100 and a display device 11202. Moreover, the CCU 11201 receives an image signal from the camera head 11102, and provides, to the image signal, various kinds of image processing such as development processing (demosaic processing) for displaying an image based on the image signal.

The display device 11202 displays, under control of the CCU 11201, an image based on the image signal provided with the image processing by the CCU 11201.

The light source device 11203 is achieved by a light source such as a light emitting diode (LED), for example, and supplies, to the endoscope 11100, irradiation light at image capturing of, for example, an operation site.

An input device 11204 is an input interface for the endoscope operation system 11000. A user can input various kinds of information and instructions to the endoscope operation system 11000 through the input device 11204. For example, the user inputs an instruction or the like to change a condition (for example, the kind of irradiation light, the magnification, or the focal length) of image capturing by the endoscope 11100.

A treatment instrument control device 11205 controls drive of the energy treatment instrument 11112 for, for example, tissue cauterization, incision, or blood vessel sealing. To obtain the visual field of the endoscope 11100 and a work space for an operator, a pneumoperitoneum apparatus 11206 feeds gas into the body cavity of the patient 11132 through the pneumoperitoneum tube 11111 to expand the body cavity. A recorder 11207 is a device capable of recording various kinds of information related to operations. A printer 11208 is a device capable of printing various kinds of information related to operations in various formats of text, image, graph, and the like.

Note that the light source device 11203 configured to supply irradiation light to the endoscope 11100 at image capturing of an operation site may be a white light source achieved by, for example, an LED, a laser beam source, or a combination thereof. In a case where the white light source is achieved by a combination of RGB laser beam sources, the output intensity and output timing of each color (each wavelength) can be highly accurately controlled, and thus the light source device 11203 can adjust the white balance of a captured image. Furthermore, in this case, an image corresponding to each of RGB can be captured in a time divisional manner by irradiating an observation target with laser beams from the respective RGB laser beam sources in a time divisional manner and controlling drive of the image sensor of the camera head 11102 in synchronization with the timing of the irradiation. According to this method, a color image can be obtained without a color filter provided to the image sensor.

Furthermore, drive of the light source device 11203 may be controlled to change the intensity of output light in each predetermined time. A high dynamic range image without what is called a black defect and overexposure can be generated by controlling drive of the image sensor of the camera head 11102 in synchronization with the timing of change of the light intensity to acquire images in a time divisional manner and synthesizing the images.

Furthermore, the light source device 11203 may be capable of supplying light in a predetermined wavelength band corresponding to special light observation. The special light observation involves, for example, what is called narrow band light observation (narrow band imaging) that performs image capturing of a predetermined tissue such as a blood vessel in a mucous membrane surface layer at high contrast by emitting light in a band narrower than that of irradiation light (in other words, white light) at normal observation by utilizing the wavelength dependency of light absorption at a body tissue. Alternatively, the special light observation may involve fluorescence observation that obtains an image through fluorescence caused by excitation light irradiation. In the fluorescence observation, for example, fluorescence from a body tissue can be observed by irradiating the body tissue with excitation light (autofluorescence observation), or a fluorescent image can be obtained by locally injecting a reagent such as indocyanine green (ICG) into a body tissue and irradiating the body tissue with excitation light corresponding to the fluorescence wavelength of the reagent. The light source device 11203 may be capable of supplying narrow band light and/or excitation light corresponding to such special light observation.

Figure 30:
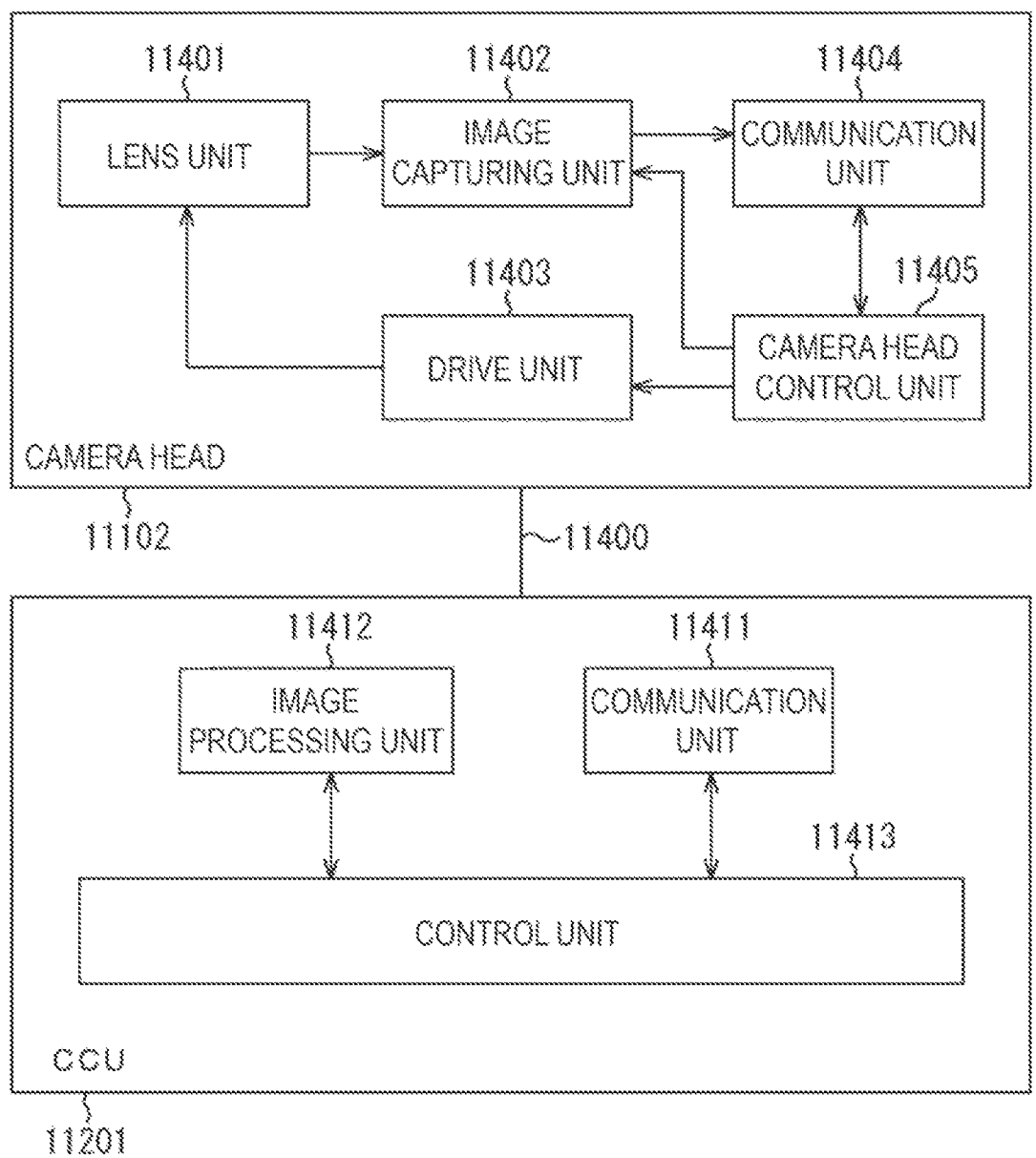
FIG. 30 is a block diagram illustrating an exemplary functional configuration of a camera head and a CCU.

FIG. 30 is a block diagram illustrating exemplary functional configurations of the camera head 11102 and the CCU 11201 illustrated in FIG. 29.

The camera head 11102 includes a lens unit 11401, an image capturing unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected with each other through a transmission cable 11400 to perform communication therebetween.

The lens unit 11401 is an optical system provided at a connection part with the lens barrel 11101. Observation light acquired from the leading end of the lens barrel 11101 is guided to the camera head 11102 and incident on the lens unit 11401. The lens unit 11401 is achieved by a combination of a plurality of lenses including a zoom lens and a focus lens.

The image capturing unit 11402 may include one image sensor (what is called a single-plate type) or a plurality of image sensors (what is called a multi-plate type). In a case where the image capturing unit 11402 is of the multi-plate type, for example, image signals corresponding to RGB, respectively, are generated by the image sensors and synthesized to obtain a color image. Alternatively, the image capturing unit 11402 may include a pair of image sensors for acquiring image signals for right and left eyes, respectively, to achieve three-dimensional (3D) display. When 3D display is performed, the operator 11131 can more accurately recognize the depth of a living body tissue at an operation site. Note that, in a case where the image capturing unit 11402 is of the multi-plate type, a plurality of systems of lens units 11401 may be provided for the respective image sensors.

Furthermore, the image capturing unit 11402 does not necessarily need to be provided to the camera head 11102. For example, the image capturing unit 11402 may be provided right after the objective lens inside the lens barrel 11101.

The drive unit 11403 is achieved by an actuator and moves, under control of the camera head control unit 11405, each of the zoom lens and the focus lens of the lens unit 11401 by a predetermined distance in the optical axis. Accordingly, the magnification and focal position of an image captured by the image capturing unit 11402 can be adjusted as appropriate.

The communication unit 11404 is achieved by a communication device for communicating various kinds of information with the CCU 11201. The communication unit 11404 transmits an image signal acquired from the image capturing unit 11402 to the CCU 11201 through the transmission cable 11400 as RAW data.

Furthermore, the communication unit 11404 receives, from the CCU 11201, a control signal for controlling drive of the camera head 11102, and supplies the control signal to the camera head control unit 11405. The control signal includes, for example, information associated with image capturing conditions such as information for specifying the frame rate of the captured image, information for specifying the exposure value at image capturing, and/or information specifying the magnification and focal position of the captured image.

Note that the above-described image capturing conditions such as the frame rate, the exposure value, the magnification, and the focal position may be specified by the user as appropriate or automatically set by the control unit 11413 of the CCU 11201 on the basis of an acquired image signal. In the latter case, the endoscope 11100 has what is called an auto exposure (AE) function, an auto focus (AF) function, and an auto white balance (AWB) function.

The camera head control unit 11405 controls drive of the camera head 11102 on the basis of a control signal received from the CCU 11201 through the communication unit 11404.

The communication unit 11411 is achieved by a communication device for communicating various kinds of information with the camera head 11102. The communication unit 11411 receives an image signal transmitted from the camera head 11102 through the transmission cable 11400.

Furthermore, the communication unit 11411 transmits, to the camera head 11102, a control signal for controlling drive of the camera head 11102. Image signals and control signals can be transmitted by, for example, electric communication and optical communication.

The image processing unit 11412 provides various kinds of image processing to an image signal as RAW data transmitted from the camera head 11102.

The control unit 11413 performs various kinds of control related to image capturing of an operation site or the like by the endoscope 11100 and display of a captured image obtained by the image capturing of the operation site or the like. For example, the control unit 11413 generates a control signal for controlling drive of the camera head 11102.

Furthermore, the control unit 11413 displays, on the display device 11202, a captured image including an operation site or the like on the basis of an image signal provided with image processing by the image processing unit 11412. In this case, the control unit 11413 may recognize various objects in the captured image by using various image recognition technologies. For example, the control unit 11413 can recognize, for example, an operation instrument such as forceps, a particular living body site, bleeding, or mist at use of the energy treatment instrument 11112 by detecting, for example, the shape or color of an edge of an object included in the captured image. When displaying the captured image on the display device 11202, the control unit 11413 may use a result of the recognition to display various kinds of operation support information on an image of the operation site in a superimposing manner. When the operation support information is displayed in a superimposing manner and presented to the operator 11131, a load on the operator 11131 can be reduced, and the operator 11131 can reliably perform the operation.

The transmission cable 11400 connecting the camera head 11102 and the CCU 11201 is an electric signal cable compatible with electric signal communication, an optical fiber compatible with optical communication, or a composite cable thereof.

In the illustrated example, wired communication is performed through the transmission cable 11400, but communication between the camera head 11102 and the CCU 11201 may be performed in a wireless manner.

The above describes an exemplary endoscope operation system to which the technology according to the present disclosure is applicable. The technology according to the present disclosure is applicable to the endoscope 11100, the camera head 11102 (the image capturing unit 11402 thereof), the CCU 11201 (the image processing unit 11412 thereof), and the like in the above-described configuration. Specifically, the image capturing apparatus 1 including the ADC 42 illustrated in, for example, FIG. 3 is applicable to the image capturing unit 10402.

Note that the above describes an example of an endoscope operation system, but the technology according to the present disclosure is applicable to, for example, a microscope operation system.

<Exemplary Application to Moving Object>

The technology (present technology) according to the present disclosure is applicable to various products. For example, the technology according to the present disclosure may be achieved as a device mounted on any kind of moving object such as an automobile, an electric vehicle, a hybrid electric vehicle, an automatic two-wheel vehicle, a bicycle, a personal mobility, an airplane, a drone, a ship, or a robot.

Figure 31:
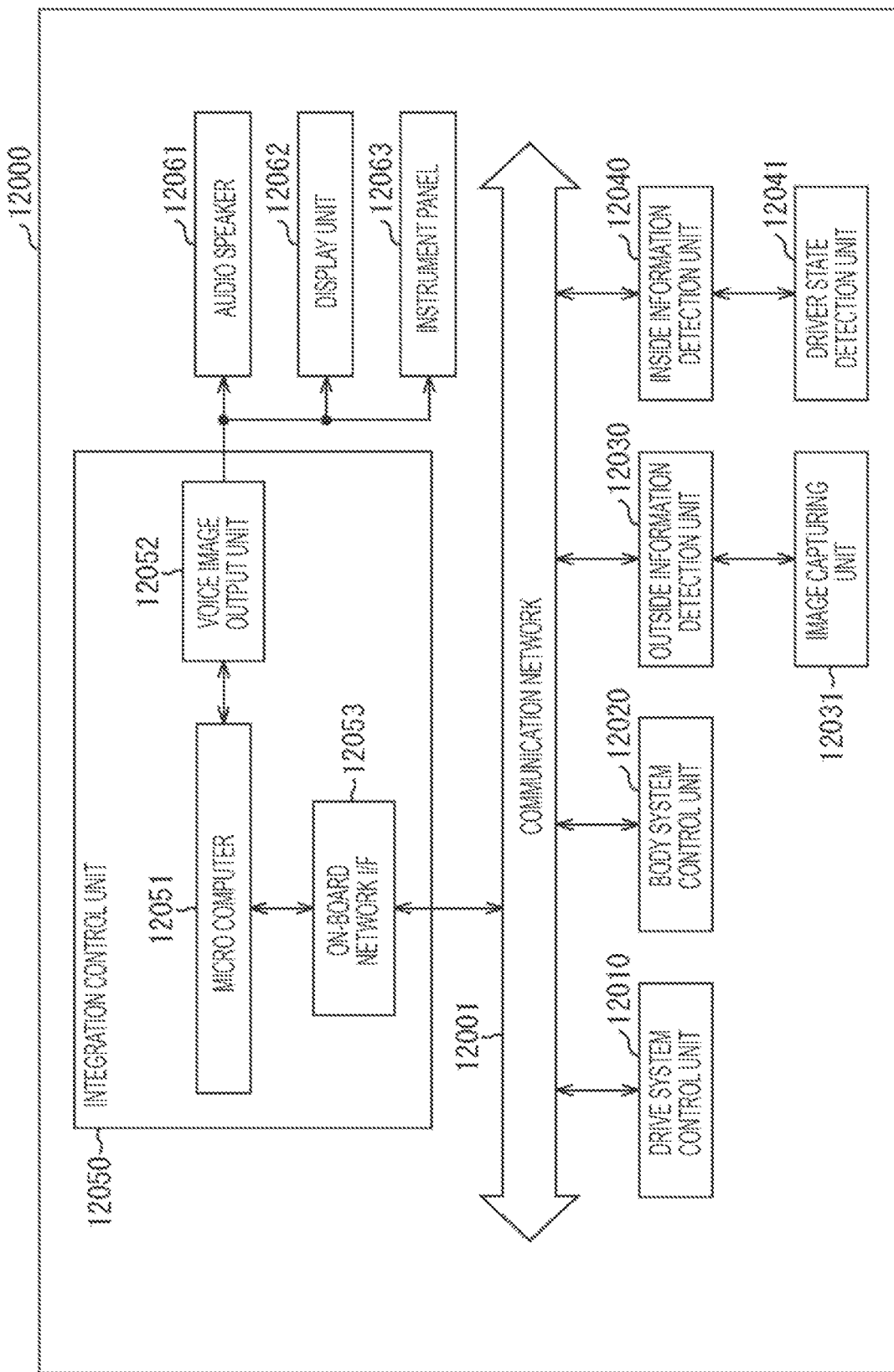
FIG. 31 is a block diagram illustrating an exemplary schematic configuration of a vehicle control system.

FIG. 31 is a block diagram illustrating an exemplary schematic configuration of a vehicle control system as an exemplary moving object control system to which the technology according to the present disclosure is applicable.

A vehicle control system 12000 includes a plurality of electronic control units connected with each other through a communication network 12001. In the example illustrated in FIG. 31, the vehicle control system 12000 includes a drive system control unit 12010, a body system control unit 12020, an outside information detection unit 12030, an inside information detection unit 12040, and an integration control unit 12050. Furthermore, a micro computer 12051, a voice image output unit 12052, and an on-board network interface (I/F) 12053 are illustrated as functional components of the integration control unit 12050.

The drive system control unit 12010 controls device operations related to the drive system of a vehicle in accordance with various computer programs. For example, the drive system control unit 12010 functions as a control device of, for example, a drive power generation device such as an internal combustion or a drive motor configured to generate drive power of the vehicle, a drive power transmission mechanism configured to transfer the drive power to wheels, a steering mechanism configured to adjust the angle of the vehicle, and a braking device configured to generate braking force of the vehicle.

The body system control unit 12020 controls operations of various devices mounted on the vehicle body in accordance with various computer programs. For example, the body system control unit 12020 functions as a control device of a keyless entry system, a smart key system, a power window device, and various lamps such as a head lamp, a rear lamp, a brake lamp, an indicator, and a fog lamp. In this case, the body system control unit 12020 may receive radio wave emitted by a portable device as an alternative key or various switch signals. The body system control unit 12020 receives inputting of the radio wave or signals and controls a door lock device, a power window device, a lamp, and the like of the vehicle.

The outside information detection unit 12030 detects information regarding the outside of the vehicle on which the vehicle control system 12000 is mounted. For example, the outside information detection unit 12030 is connected with an image capturing unit 12031. The outside information detection unit 12030 causes the image capturing unit 12031 to capture an image of the outside, and receives the captured image. The outside information detection unit 12030 may perform, on the basis of the received image, object detection processing or distance detection processing for, for example, a person, a vehicle, an obstacle, a sign, or a character on a road surface.

The image capturing unit 12031 is a light sensor configured to receive light and output an electric signal in accordance with the received amount of the light. The image capturing unit 12031 may output the electric signal as an image or as distance measurement information. Furthermore, the light received by the image capturing unit 12031 may be visible light or invisible light such as infrared.

The inside information detection unit 12040 detects information regarding the inside of the vehicle. The inside information detection unit 12040 is connected with, for example, a driver state detection unit 12041 configured to detect the state of the driver. The driver state detection unit 12041 includes, for example, a camera configured to capture an image of the driver, and the inside information detection unit 12040 may calculate the fatigue degree or concentration degree of the driver on the basis of detection information input from the driver state detection unit 12041 or may determine whether the driver is asleep.

The micro computer 12051 may calculate a control target value of the drive power generation device, the steering mechanism, or the braking device on the basis of the outside or inside information acquired by the outside information detection unit 12030 or the inside information detection unit 12040, and output a control command to the drive system control unit 12010. For example, the micro computer 12051 can perform coordination control to achieve functions of an advanced driver assistance system (ADAS) such as avoidance or impact reduction of vehicle collision, following travel, vehicle speed maintaining travel, and vehicle collision warning based on the inter-vehicle distance, and vehicle lane deviation warning.

Furthermore, the micro computer 12051 can perform coordination control to achieve, for example, an automatic driving for automatic traveling independently from an operation by the driver by controlling, for example, the drive power generation device, the steering mechanism, or the braking device on the basis of information regarding the surrounding of the vehicle acquired by the outside information detection unit 12030 or the inside information detection unit 12040.

Furthermore, the micro computer 12051 can output a control command to the body system control unit 12020 on the basis of the outside information acquired by the outside information detection unit 12030. For example, the micro computer 12051 can control the head lamp in accordance with the position of a preceding vehicle or an oncoming vehicle sensed by the outside information detection unit 12030, thereby performing coordination control to achieve an antidazzle operation such as switching from a high beam to a low beam.

The voice image output unit 12052 transmits an output signal of at least one of voice or an image to an output device capable of providing notification of information to a person on board or the outside of the vehicle in a visual or auditory manner. In the example illustrated in FIG. 31, the output device is an audio speaker 12061, a display unit 12062, and an instrument panel 12063. The display unit 12062 may include, for example, at least one of an on-board display or a head-up display.

Figure 32:
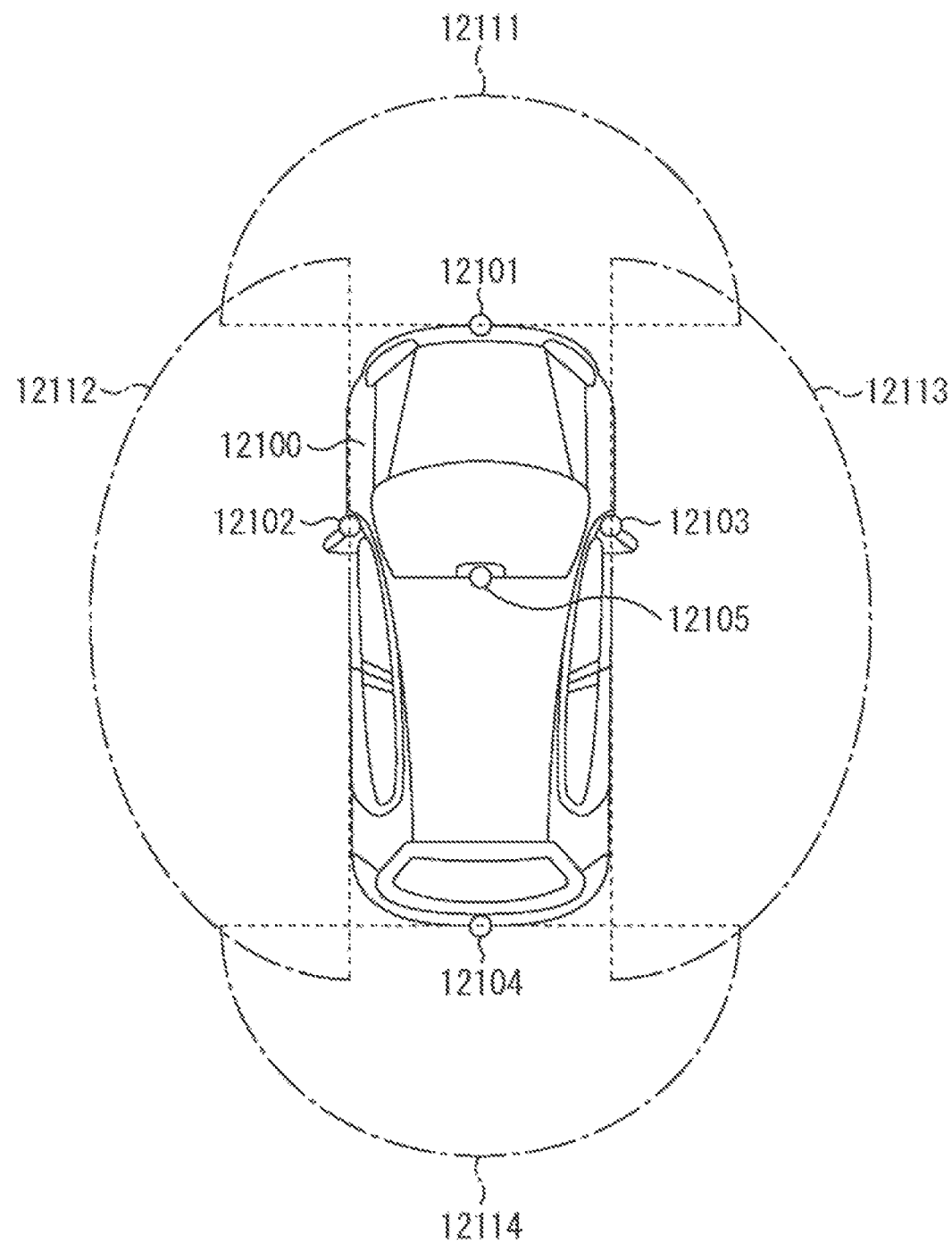
FIG. 32 is an explanatory diagram illustrating an exemplary installation position of an image capturing unit.

FIG. 32 is a diagram illustrating an exemplary installation position of the image capturing unit 12031.

In FIG. 32, image capturing units 12101, 12102, 12103, 12104, and 12105 are provided as the image capturing unit 12031.

The image capturing units 12101, 12102, 12103, 12104, and 12105 are provided at, for example, the positions of the front nose, the side mirrors, the rear bumper, the backdoor, an upper part of the windshield inside the vehicle, and the like of a vehicle 12100. The image capturing unit 12101 provided to the front nose and the image capturing unit 12105 provided to the upper part of the windshield inside the vehicle mainly acquire images on the front side of the vehicle 12100. The image capturing units 12102 and 12103 provided to the side mirrors mainly acquire images on sides of the vehicle 12100. The image capturing unit 12104 provided to the rear bumper or the backdoor mainly acquires an image on the back side of the vehicle 12100. The image capturing unit 12105 provided to the upper part of the front glass inside the vehicle is mainly used to detect, for example, a preceding vehicle, a pedestrian, an obstacle, a traffic light, a traffic sign, and a lane.

Note that FIG. 32 illustrates exemplary image capturing ranges of the image capturing units 12101 to 12104. An image capturing range 12111 indicates the image capturing range of the image capturing unit 12101 provided to the front nose, image capturing ranges 12112 and 12113 indicate the image capturing ranges of the image capturing units 12102 and 12103 provided to the side mirrors, respectively, and an image capturing range 12114 indicates the image capturing range of the image capturing unit 12104 provided to the rear bumper or the backdoor. For example, image data captured by the image capturing units 12101 to 12104 is placed over to obtain a panoramic image of the vehicle 12100 when viewed from above.

At least one of the image capturing units 12101 to 12104 may have a function to acquire distance information. For example, at least one of the image capturing units 12101 to 12104 may be a stereo camera including a plurality of image sensors, or may be an image sensor including pixels for phase difference detection.

For example, the micro computer 12051 can calculate the distance to each solid object in the image capturing ranges 12111 to 12114 and temporal change of the distance (speed relative to the vehicle 12100) on the basis of distance information obtained from the image capturing units 12101 to 12104, thereby extracting, as a preceding vehicle, for example, a solid object positioned nearest on the traveling lane of the vehicle 12100 and traveling at a predetermined speed (for example, 0 km/h or higher) in a direction substantially same as that of the vehicle 12100. Moreover, the micro computer 12051 can set, behind the preceding vehicle, an inter-vehicle distance to be held in advance and perform, for example, automatic brake control (including following stop control) and automatic acceleration control (including following start control). In this manner, coordination control can be performed to achieve, for example, automatic driving for automatic traveling independently from an operation by the driver.

For example, the micro computer 12051 can classify solid object data related to a solid object into a two-wheel vehicle, a standard-size vehicle, a large-size vehicle, a pedestrian, a utility pole, and another solid object on the basis of distance information obtained from the image capturing units 12101 to 12104, extract the solid object data, and use the solid object data for obstacle automatic avoidance. For example, the micro computer 12051 identifies each obstacle around the vehicle 12100 as an obstacle that can be visually recognized by the driver of the vehicle 12100 or an obstacle that cannot be visually recognized. Then, the micro computer 12051 determines a collision risk indicating the potential of collision with the obstacle, and when the collision risk is equal to or higher than a set value and collision is likely, can perform operation support to avoid collision by outputting an alert to the driver through the audio speaker 12061 and the display unit 12062 or performing forced deceleration or evasive steering through the drive system control unit 12010.

At least one of the image capturing units 12101 to 12104 may be an infrared camera configured to detect infrared. For example, the micro computer 12051 determines whether or not a pedestrian is included in an image captured by at least one of the image capturing units 12101 to 12104, thereby recognizing the pedestrian. Such pedestrian recognition is performed through, for example, the procedure of extracting a feature point in the image captured by at least one of the image capturing units 12101 to 12104 as an infrared camera, and the procedure of performing pattern matching processing on a series of feature points indicating the outline of an object to determine whether or not a pedestrian is included. When the micro computer 12051 determines that a pedestrian is included in the image captured by at least one of the image capturing units 12101 to 12104, and recognizes the pedestrian, the voice image output unit 12052 controls the display unit 12062 to display a square outline line on the recognized pedestrian in a superimposing manner for emphasis. Furthermore, the voice image output unit 12052 may control the display unit 12062 to display, at a desired position, an icon or the like indicating the pedestrian.

The above describes an exemplary vehicle control system to which the technology according to the present disclosure is applicable. The technology according to the present disclosure is applicable to, for example, the image capturing unit 12031 or the like in the above-described configuration. Specifically, the image capturing apparatus 1 including the ADC 42 illustrated in, for example, FIG. 3 is applicable to the image capturing unit 12031.

Note that, in the present specification, a system is the entire device including a plurality of devices.

It is to be noted that the effects described in the present specification are merely examples and are not intended to be limiting, and other effects may be provided.

It is to be noted that the embodiments of the present technology are not limited to the above-described embodiments, and various modifications are possible without departing from the gist of the present technology.

It is to be noted that the present disclosure may be configured as described below.

(1)

An image capturing apparatus including:

a photoelectric conversion element;

a conversion unit configured to convert a signal from the photoelectric conversion element into a digital signal; and a control unit configured to control current flowing to an analog circuit on the basis of an output signal from the conversion unit.

(2)

The image capturing apparatus according to (1), in which the conversion unit converts the signal from the photoelectric conversion element into a digital signal by using a slope signal having a level that monotonically decreases as time elapses.

(3)

The image capturing apparatus according to (1) or (2), in which the control unit performs control to reduce current flowing to the analog circuit in a case where the output signal has a large level.

(4)

The image capturing apparatus according to any of (1) to (3), in which the control unit performs control to increase current flowing to the analog circuit in a case where the output signal has a small level.

(5)

The image capturing apparatus according to any of (1) to (4), in which the analog circuit is a source follower, and the control unit controls current flowing through the source follower.

(6)

The image capturing apparatus according to any of (1) to (5), in which the analog circuit is a gain amplifier, and the control unit controls current flowing through the gain amplifier.

(7)

The image capturing apparatus according to any of (1) to (6), in which the analog circuit is a comparison circuit included in the conversion unit, and the control unit controls current flowing through the comparison circuit.

(8)

The image capturing apparatus according to any of (1) to (7), in which the analog circuit is a reference signal generation unit configured to generate a reference signal supplied to the conversion unit, and the control unit controls current flowing through the reference signal generation unit.

(9)

The image capturing apparatus according to any of (1) to (8), in which the control unit performs control for all pixels, each pixel, each column, or each pixel block.

(10)

The image capturing apparatus according to any of (1) to (9), in which the control unit performs control for each frame, each subframe from which one frame is generated, or each predetermined number of frames.

(11)

The image capturing apparatus according to (10), in which update of control performed by the control unit has hysteresis.

(12)

The image capturing apparatus according to any of (1) to (11), in which the control unit performs same control in an A/D conversion duration of a reset level of a pixel and an A/D conversion duration of a signal level of the pixel.

(13)

The image capturing apparatus according to any of (1) to (12), in which, in a case where one frame is generated from a plurality of subframes, the control unit applies a current value calculated in a predetermined subframe as current flowing to the analog circuit to other subframes in the same frame.

(14)

The image capturing apparatus according to any of (1) to (13), in which the output signal is a signal read from a pixel representing a predetermined pixel region vicinity, and the control unit performs the control on the basis of the read signal.

(15)

The image capturing apparatus according to (14), in which the pixel representing the pixel region vicinity is an image plane phase difference pixel.

(16)

The image capturing apparatus according to any of (1) to (15), having a stacking structure.

(17)

The image capturing apparatus according to any of (1) to (16), in which the photoelectric conversion element is included in a first layer, and the conversion unit is included in a second layer and connected with each photoelectric conversion element.

(18)

The image capturing apparatus according to any of (1) to (17), in which the photoelectric conversion element detects any of radiation, infrared light, and ambient light.

(19)

The image capturing apparatus according to any of (1) to (18), in which the single conversion unit processes output signals from a plurality of the photoelectric conversion elements.

(20)

An electronic device including an image capturing apparatus including:
a photoelectric conversion element;
a conversion unit configured to convert a signal from the photoelectric conversion element into a digital signal; and
a control unit configured to control current flowing to an analog circuit on the basis of an output signal from the conversion unit.

REFERENCE SIGNS LIST

1 Image capturing apparatus
21 Pixel
22 Pixel array unit
23 Time code forwarding unit
25 DAC
26 Time code generation unit
28 Output unit
41 Pixel circuit
42 ADC
51 Comparison circuit
52 Data storage unit
61 Differential input circuit
62 Voltage conversion circuit
63 Positive feedback circuit
71 Latch control circuit
72 Latch storage unit
81 to 87, 91 Transistor
101 to 105, 111 to 113 Transistor
401 Determination unit
501 Bias circuit

The invention claimed is:

1. An image capturing apparatus, comprising:
a photoelectric conversion element configured to generate a signal;
first circuitry configured to:
compare a voltage of the signal with a voltage of a reference signal; and
generate an output signal based on the comparison of the voltage of the signal with the voltage of the reference signal;
second circuitry configured to convert the signal from the photoelectric conversion element into a digital signal based on the output signal generated by the first circuitry; and
third circuitry configured to:
determine a determination value to control current flow to the first circuitry, wherein the determination value is determined based on the digital signal output from the second circuitry; and
control the current flow to the first circuitry based on the determination value.

2. The image capturing apparatus according to claim 1, wherein
the second circuitry is further configured to convert the signal from the photoelectric conversion element into the digital signal based on a slope signal, and a level of the slop signal monotonically decreases as time elapses.

3. The image capturing apparatus according to claim 1, wherein the third circuitry is further configured to reduce the current flow to the first circuitry in a case where the output signal is at a level higher than a threshold.

4. The image capturing apparatus according to claim 1, wherein the third circuitry is further configured to increase the current flow to the first circuitry in a case where the output signal is at a level lower than a threshold.

5. The image capturing apparatus according to claim 1, wherein
the first circuitry is a source follower, and
the third circuitry is further configured to control current flowing through the source follower.

6. The image capturing apparatus according to claim 1, wherein
the first circuitry is a gain amplifier, and
the third circuitry is further configured to control current flowing through the gain amplifier.

7. The image capturing apparatus according to claim 1, wherein
the first circuitry is a comparison circuit, and
the third circuitry is further configured to control the current flow through the comparison circuit.

8. The image capturing apparatus according to claim 1, wherein
the first circuitry is a reference signal generation unit configured to generate a reference signal supplied to second circuitry, and
the third circuitry is further configured to control current flowing through the reference signal generation unit.

9. The image capturing apparatus according to claim 1, wherein the third circuitry is further configured to control of each pixel of a plurality of pixels, each column of the plurality of pixels, or each pixel block of the plurality of pixels.

10. The image capturing apparatus according to claim 1, wherein
the third circuitry is further configured to control one of each frame of a plurality of frames, each subframe of a plurality of subframes, or a set of frames of the plurality of frames, and
one frame of the plurality of frames is generated from the plurality of subframes.

11. The image capturing apparatus according to claim 10, wherein update of control performed by the third circuitry has hysteresis.

12. The image capturing apparatus according to claim 1, wherein the third circuitry is further configured to perform same control in an A/D conversion duration of a reset level of a pixel and an A/D conversion duration of a signal level of the pixel.

13. The image capturing apparatus according to claim 1, wherein, in a case where one frame is generated from a plurality of subframes, the third circuitry is further configured to apply a current value calculated in a predetermined subframe as current flowing to the first circuitry to other subframes in the same frame.

14. The image capturing apparatus according to claim 1, wherein
the output signal is read from a pixel,
the pixel is represented by a pixel region vicinity, and
the third circuitry is further configured to control the current flow based on the read output signal.

15. The image capturing apparatus according to claim 14, wherein the pixel represented by the pixel region vicinity is an image plane phase difference pixel.

16. The image capturing apparatus according to claim 1, having a stacking structure.

17. The image capturing apparatus according to claim 1, wherein the photoelectric conversion element is included in a first layer, and the second circuitry is included in a second layer and connected with each photoelectric conversion element.

18. The image capturing apparatus according to claim 1, wherein the photoelectric conversion element is further configured to detect one of of radiation, infrared light, or ambient light.

19. The image capturing apparatus according to claim 1, wherein the second circuitry is further configured to process output signals from a plurality of the photoelectric conversion elements.

20. An electronic device, comprising:
an image capturing apparatus comprising:
a photoelectric conversion element configured to generate a signal;
first circuitry configured to:
compare a voltage of the signal with a voltage of a reference signal; and
generate an output signal based on the comparison of the voltage of the signal with the voltage of the reference signal;
second circuitry configured to convert the signal from the photoelectric conversion element into a digital signal based on the output signal generated by the first circuitry; and
third circuitry configured to:
determine a determination value to control current flow to the first circuitry, wherein the determination value is determined based on the digital signal output from the second circuitry; and
control the current flow to the first circuitry based on the determination value.

* * * * *